US011785765B2

(12) United States Patent
Lin

(10) Patent No.: US 11,785,765 B2
(45) Date of Patent: Oct. 10, 2023

(54) SEMICONDUCTOR MEMORY DEVICE WITH GUARD PILLAR AND MANUFACTURING METHOD THEREOF

(71) Applicant: Winbond Electronics Corp., Taichung (TW)

(72) Inventor: Chang-Hung Lin, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/340,073

(22) Filed: Jun. 6, 2021

(65) Prior Publication Data

US 2021/0391338 A1     Dec. 16, 2021

(30) Foreign Application Priority Data

Jun. 12, 2020   (TW) ................................ 109119806

(51) Int. Cl.
  *H10B 12/00*       (2023.01)
(52) U.S. Cl.
  CPC ........... *H10B 12/50* (2023.02); *H10B 12/312* (2023.02); *H10B 12/485* (2023.02)
(58) Field of Classification Search
  CPC .... H10B 12/50; H10B 12/312; H10B 12/485; H10B 12/09; H10B 12/482; H10B 12/315
  See application file for complete search history.

(56) References Cited

U.S. PATENT DOCUMENTS

| 8,324,049 B2 | 12/2012 | Kim et al. | |
| 8,809,162 B2 | 8/2014 | Lee et al. | |
| 9,929,162 B1 | 3/2018 | Feng et al. | |
| 2011/0101499 A1* | 5/2011 | Kim ...................... | H10B 12/033 257/532 |
| 2014/0048860 A1* | 2/2014 | Mikasa ................ | H10B 12/053 257/296 |
| 2015/0235939 A1* | 8/2015 | Lee ......................... | H10B 41/27 257/774 |
| 2021/0125998 A1* | 4/2021 | Kim ....................... | H10B 12/50 |

FOREIGN PATENT DOCUMENTS

| CN | 101996940 | 3/2011 |
| CN | 108666311 | 10/2018 |
| CN | 109755243 | 5/2019 |

OTHER PUBLICATIONS

"Office Action of China Counterpart Application", dated May 18, 2023, p. 1-p. 7.

* cited by examiner

*Primary Examiner* — Edward Chin
(74) *Attorney, Agent, or Firm* — JCIPRNET

(57) ABSTRACT

Provided are a semiconductor memory device with guard pillars and a manufacturing method thereof. The semiconductor memory device includes a substrate having a memory region and a periphery region surrounding the memory region, a plurality of bit line structures, a plurality of contacts, a plurality of guard pillars and a plurality of capacitors. The bit line structures are arranged parallel to each other on the substrate in the memory region. The contacts are disposed between the adjacent bit line structures and electrically connected to the substrate. The guard pillars are disposed on the substrate and located between the adjacent bit line structures at the boundary between the memory region and the periphery region. The capacitors are disposed on the plurality of contacts to be electrically connected to the plurality of contacts.

15 Claims, 25 Drawing Sheets

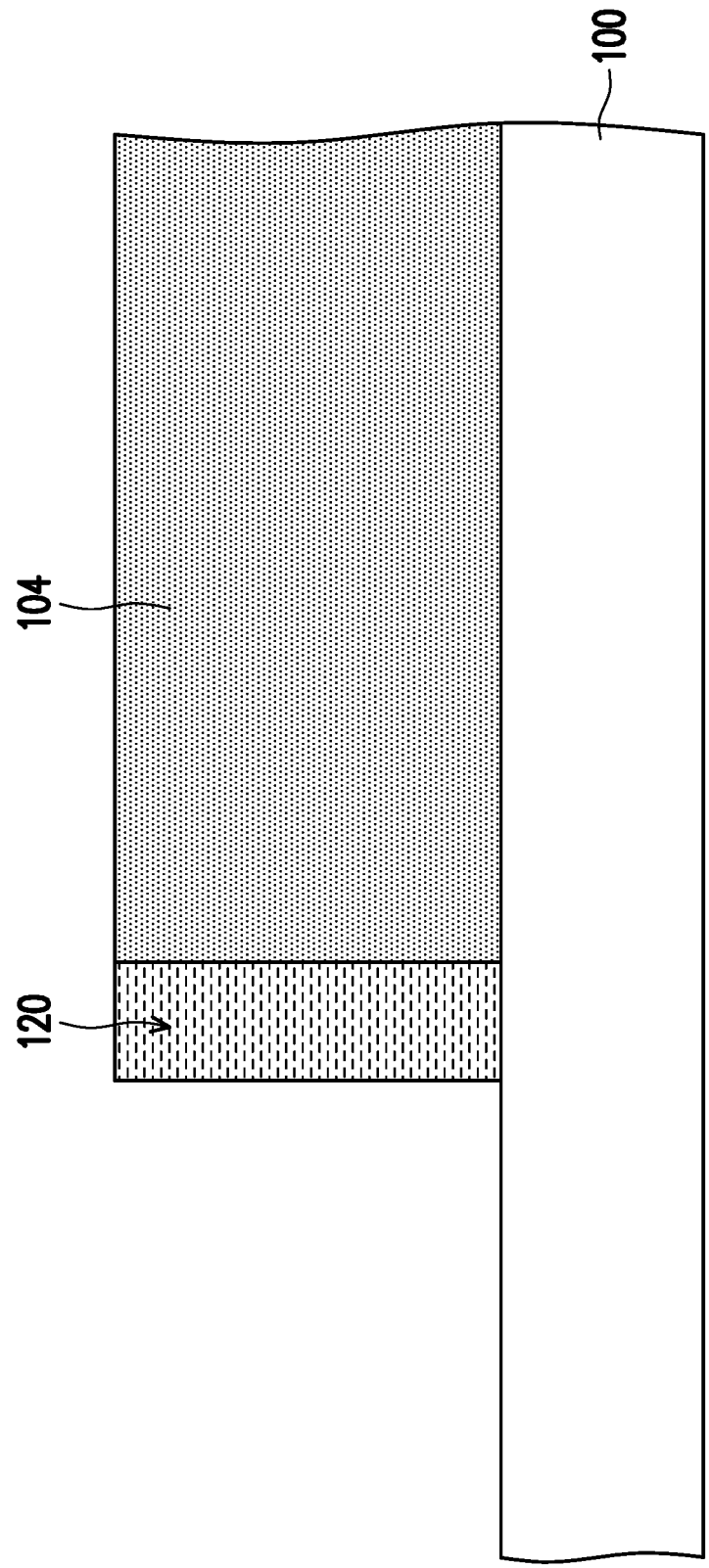

SEMICONDUCTOR MEMORY DEVICE WITH GUARD PILLAR AND MANUFACTURING METHOD THEREOF

CROSS-REFERENCE TO RELATED APPLICATION

This application claims the priority benefit of Taiwan application serial no. 109119806, filed on Jun. 12, 2020. The entirety of the above-mentioned patent application is hereby incorporated by reference herein and made a part of this specification.

BACKGROUND

Technical Field

The invention relates to a semiconductor structure and a manufacturing method thereof, in particular to a semiconductor memory device with guard pillars and a manufacturing method thereof.

Description of Related Art

In the current semiconductor memory device (such as a dynamic random access memory, DRAM) process, after forming a plurality of bit line structures arranged in parallel on the substrate, a contact electrically connected with the active area of the substrate is formed between the adjacent bit line structures. The contact is electrically connected with the capacitor formed later.

In the process of forming the contact, a position where the contact is to be formed is defined between the adjacent bit line structures, and then a wet etching process is performed to remove the dielectric layer (usually oxide layer) at the position to form a contact hole, and a conductive layer is formed in the contact hole. During the above wet etching process, in order to prevent the dielectric layer in the periphery region from being removed, a photoresist layer is formed on the dielectric layer in the periphery region to protect the dielectric layer. However, when the time of the wet etching process is too long, the dielectric layer at the boundary between the memory region and the periphery region (even the dielectric layer in the periphery region) may be partially removed to affect the subsequent process. In addition, if the above photoresist layer covers to the boundary between the memory region and the periphery region (or even covers a part of the memory region) in order to avoid the above problems, it may cause that the dielectric layer at the position where the contact hole is formed later cannot be completely removed and thus the contact cannot be formed.

SUMMARY

The present invention provides a semiconductor memory device with guard pillars and a manufacturing method thereof, wherein a plurality of guard pillars are disposed between the adjacent stack structures (eg, bit line structures) with a conductive material at the boundary between the memory region and the periphery region.

A semiconductor memory device with guard pillars of the present invention includes a substrate having a memory region and a periphery region surrounding the memory region, a plurality of bit line structures, a plurality of contacts, a plurality of guard pillars and a plurality of capacitors. The bit line structures are arranged parallel to each other on the substrate in the memory region. The contacts are disposed between the adjacent bit line structures and electrically connected to the substrate. The guard pillars are disposed on the substrate and located between the adjacent bit line structures at the boundary between the memory region and the periphery region. The capacitors are disposed on the plurality of contacts to be electrically connected to the plurality of contacts.

A manufacturing method of the semiconductor memory device with guard pillar of the present invention includes the following steps. A substrate is provided, wherein the substrate has a memory region and a periphery region surrounding the memory region. A plurality of bit line structures are formed on the substrate, wherein the plurality of bit line structures are arranged parallel to each other on the substrate in the memory region. A dielectric layer is formed on the substrate in the memory region and the periphery region. A plurality of insulating pillars are formed in the dielectric layer between the adjacent bit line structures in the memory region. A plurality of guard pillars are formed in the dielectric layer between the adjacent bit line structures at the boundary between the memory region and the periphery region. A first patterned mask layer is formed, wherein the first patterned mask layer covers at least the dielectric layer in the periphery region. A wet etching process is performed to remove the dielectric layer in the memory region to form a plurality of contact holes between the adjacent bit line structures. A conductive layer is formed in the plurality of contact holes to form a plurality of contacts. A plurality of capacitors are formed to electrically connect to the plurality of contacts on the plurality of contacts.

Based on the above, in the process of forming the semiconductor memory device of the present invention, the guard pillar are formed between the adjacent bit line structures at the boundary between the memory region and the periphery region, so the wet etching process can be used to quickly and thoroughly remove the dielectric layer in the memory region to form a contact hole, and at the same time, the dielectric layer in the periphery region is prevented from being etched and affecting subsequent processes.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIGS. 4A to 4H are schematic cross-sectional views of the manufacturing process along the C-C line in FIGS. 1A to 1H.

DESCRIPTION OF THE EMBODIMENTS

Figure 1A:
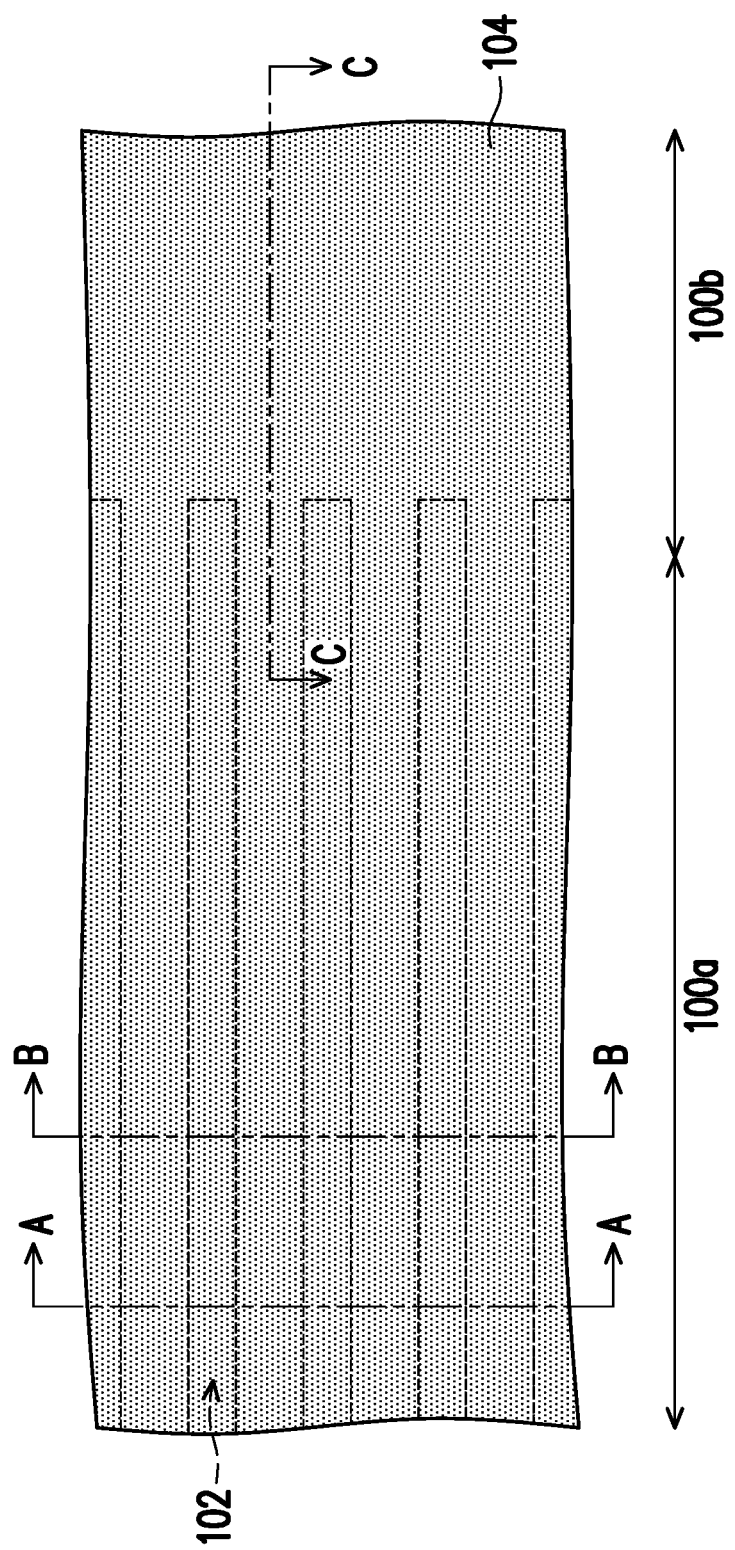
FIGS. 1A to 1H are schematic top views of a manufacturing process of a semiconductor memory device according to an embodiment of the invention.
Figure 1B:
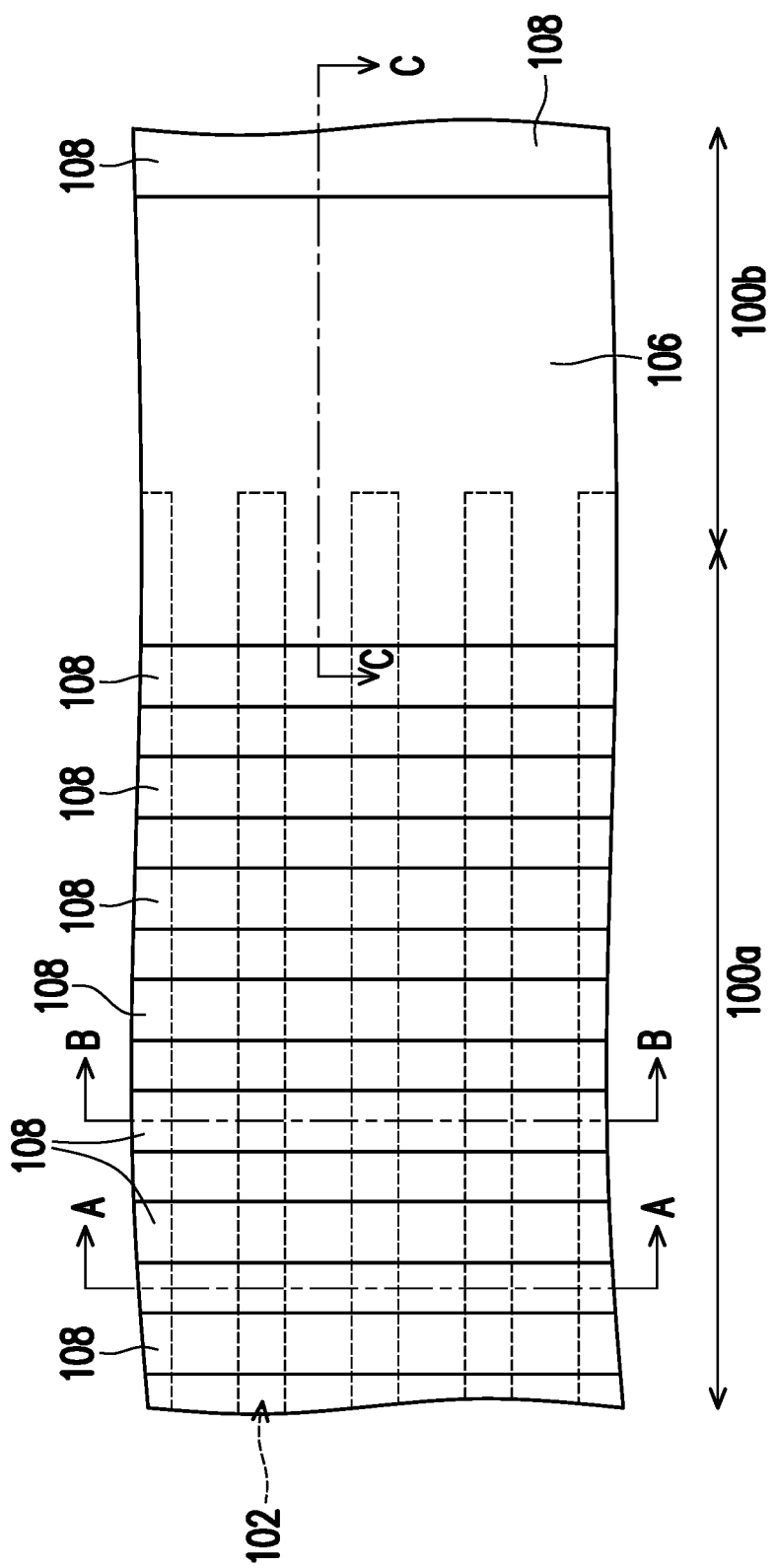
Figure 1C:
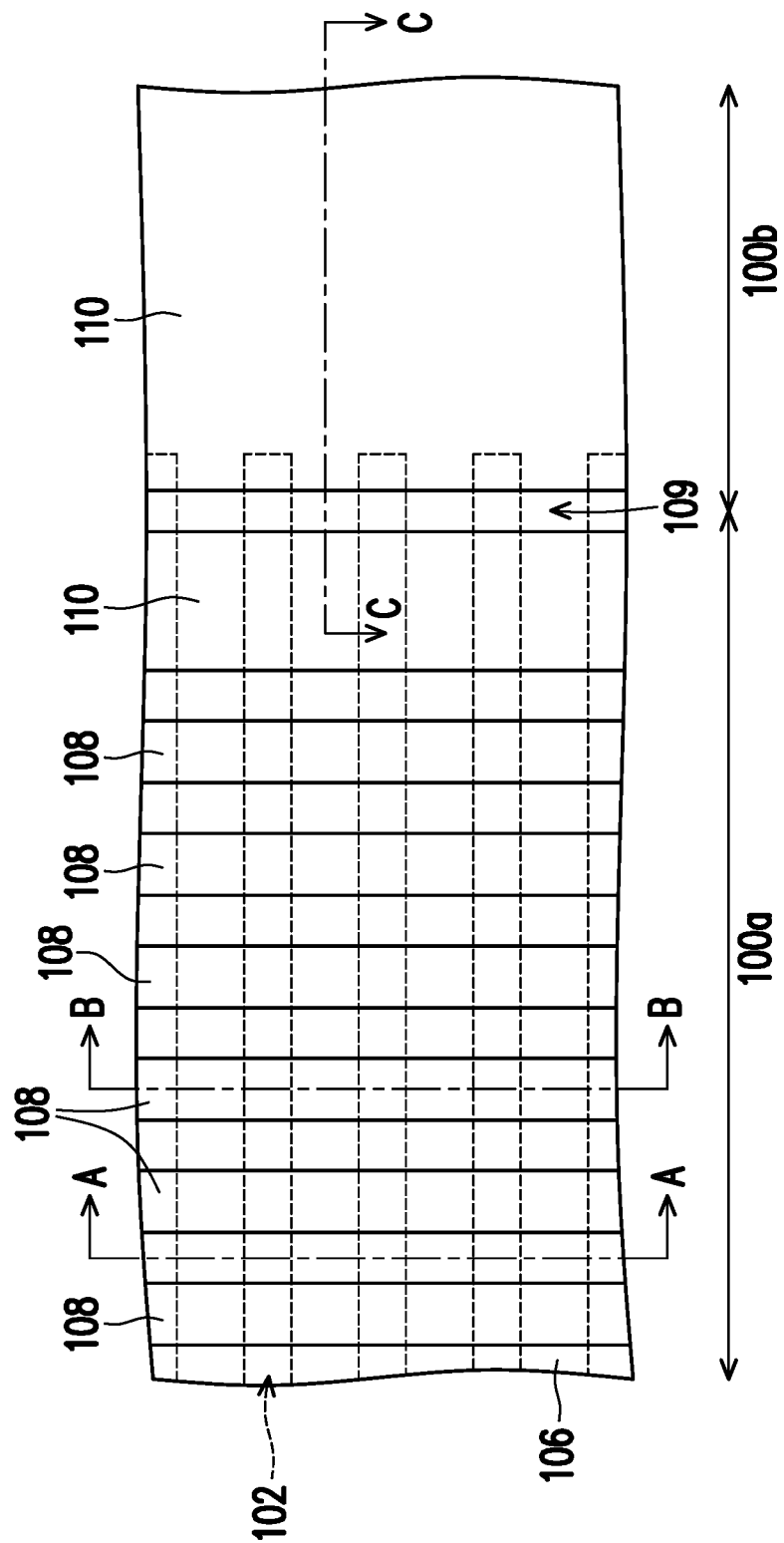
Figure 1D:
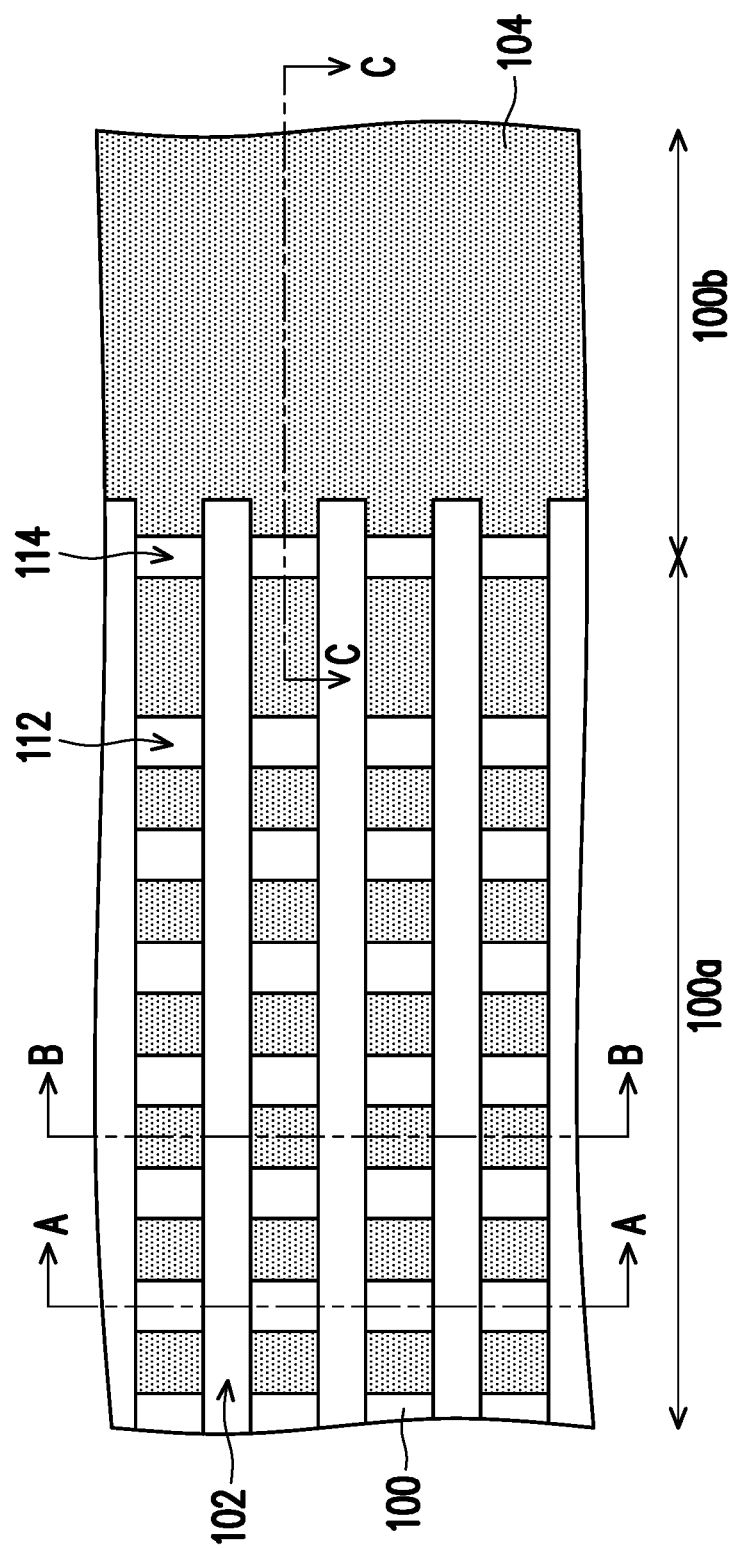
Figure 1E:
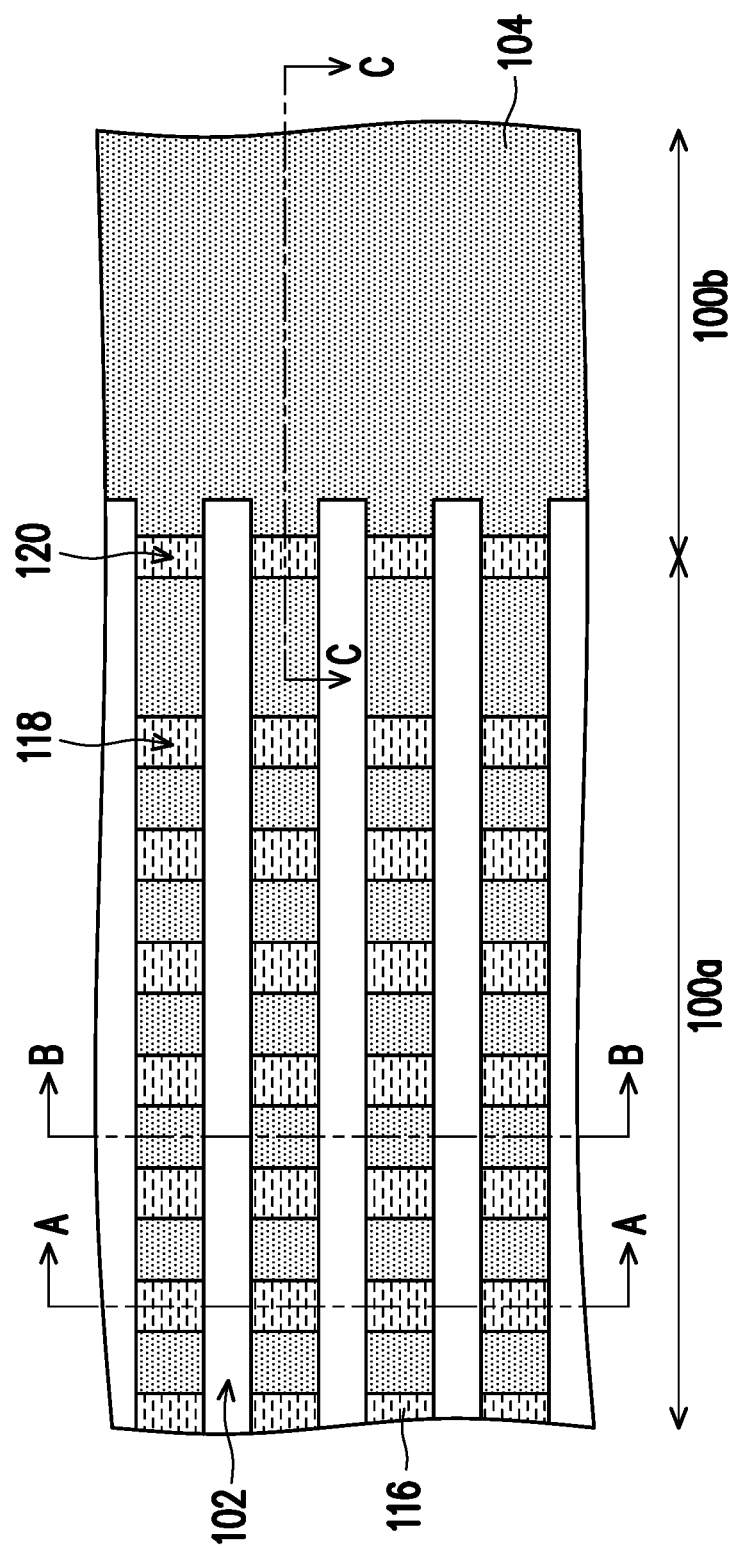
Figure 1F:
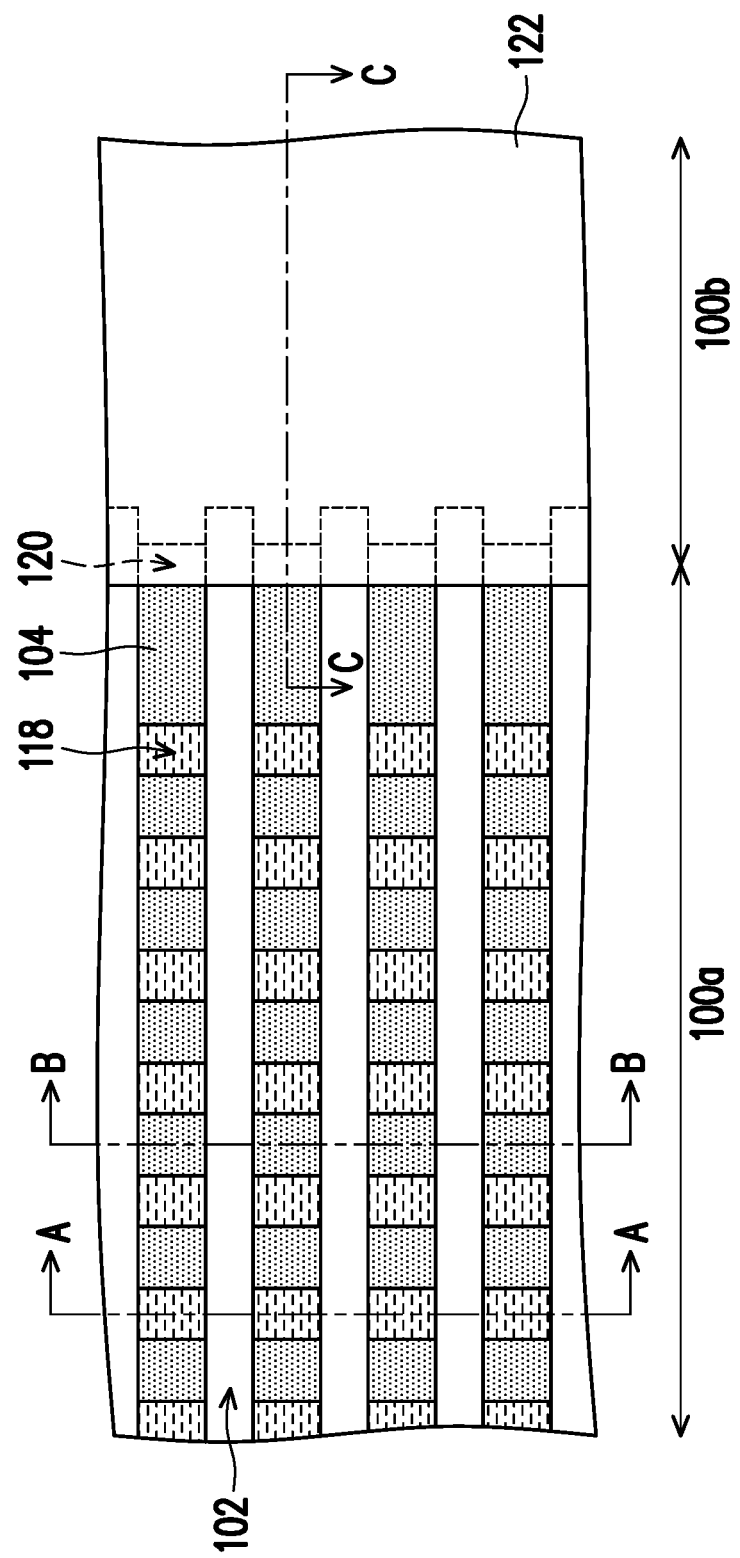
Figure 1G:
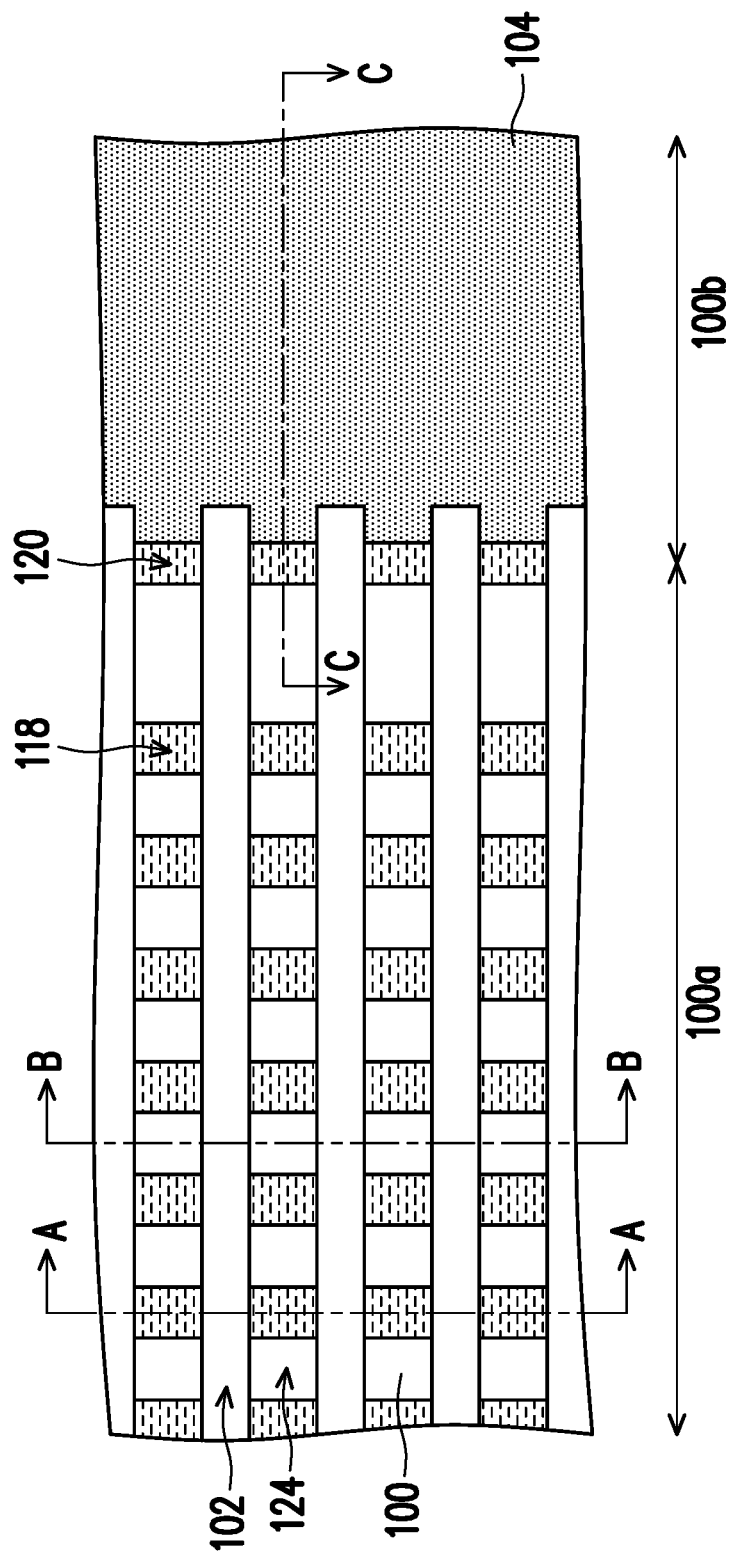
Figure 1H:
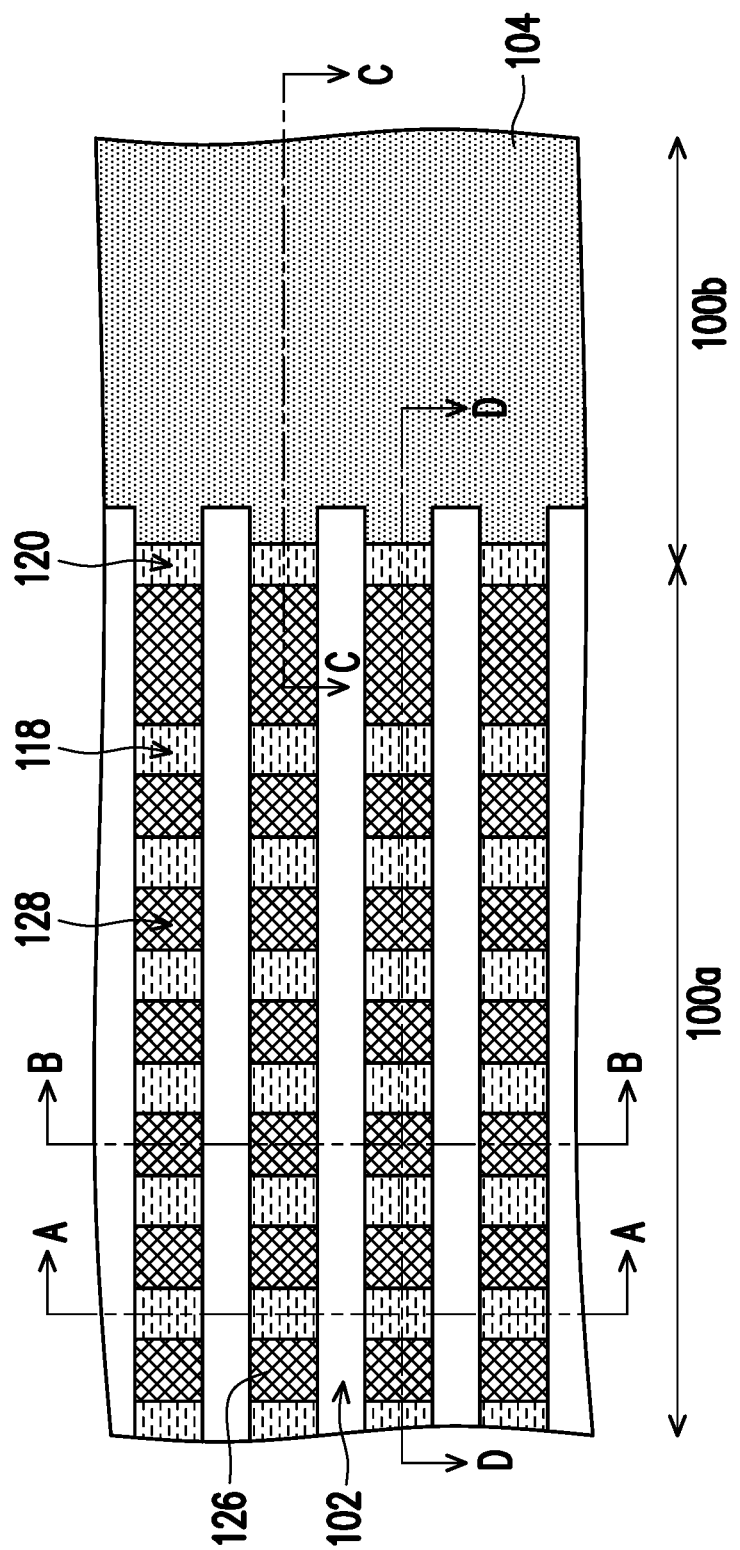
Figure 2A:
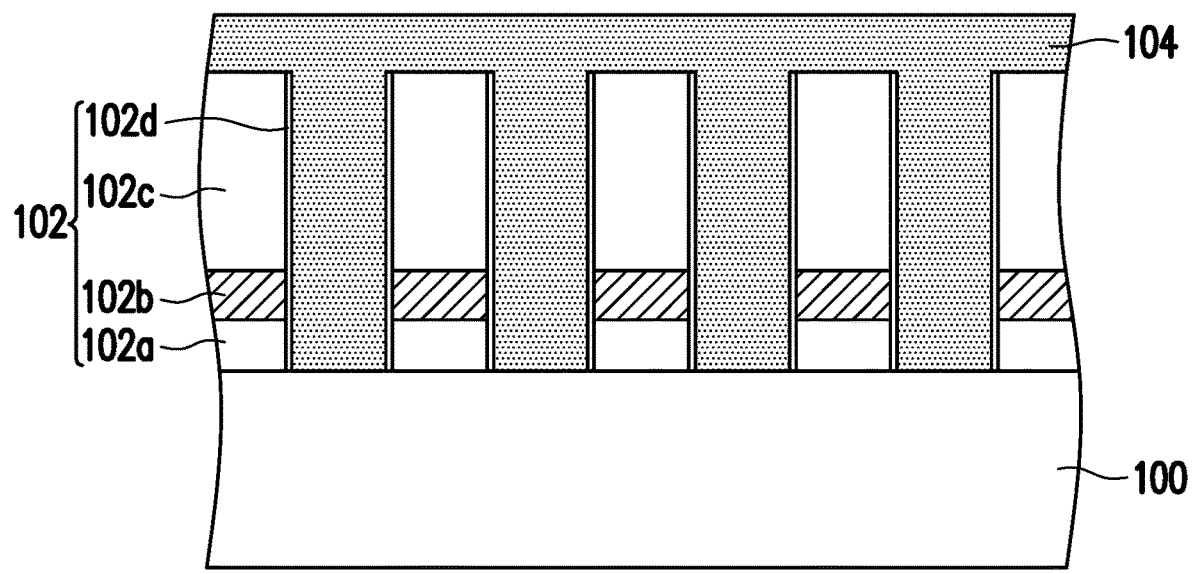
FIGS. 2A to 2H are schematic cross-sectional views of the manufacturing process along the A-A line in FIGS. 1A to 1H.
Figure 2B:
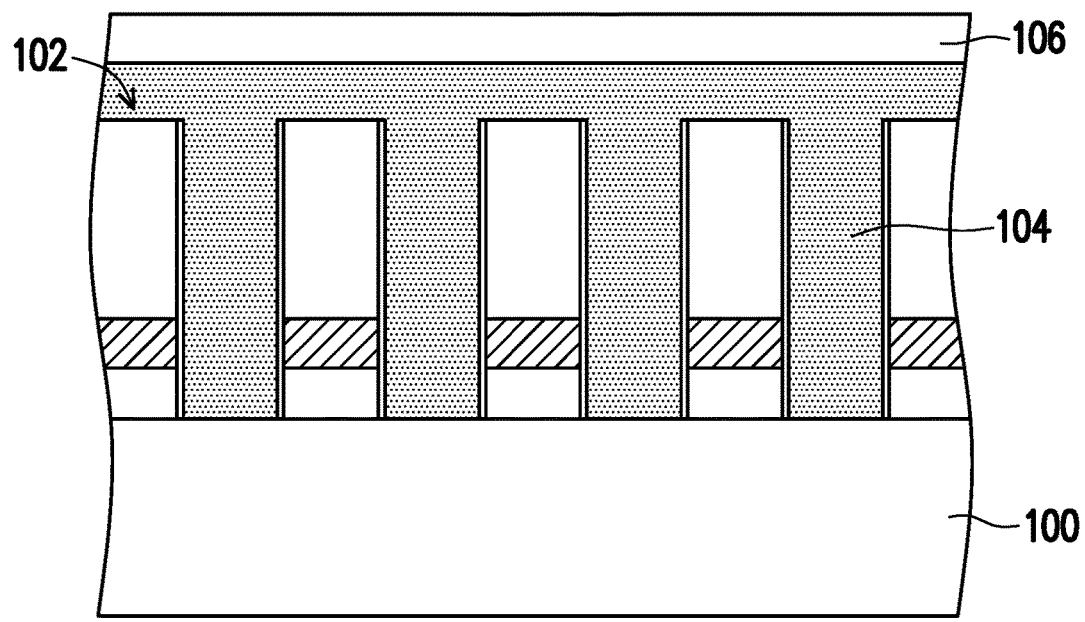
Figure 2C:
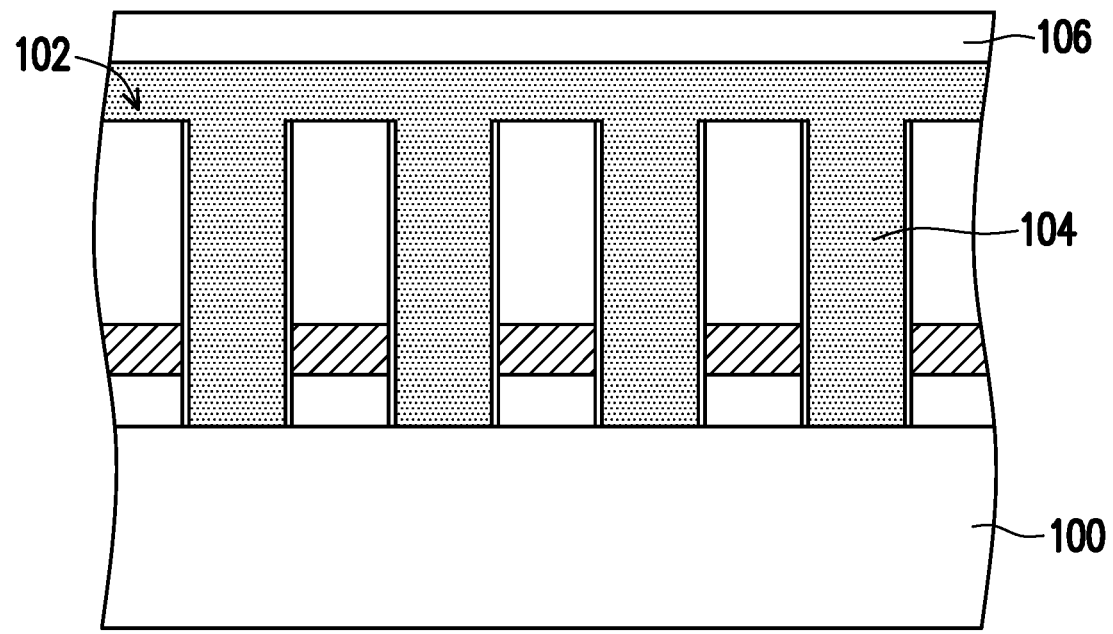
Figure 2D:
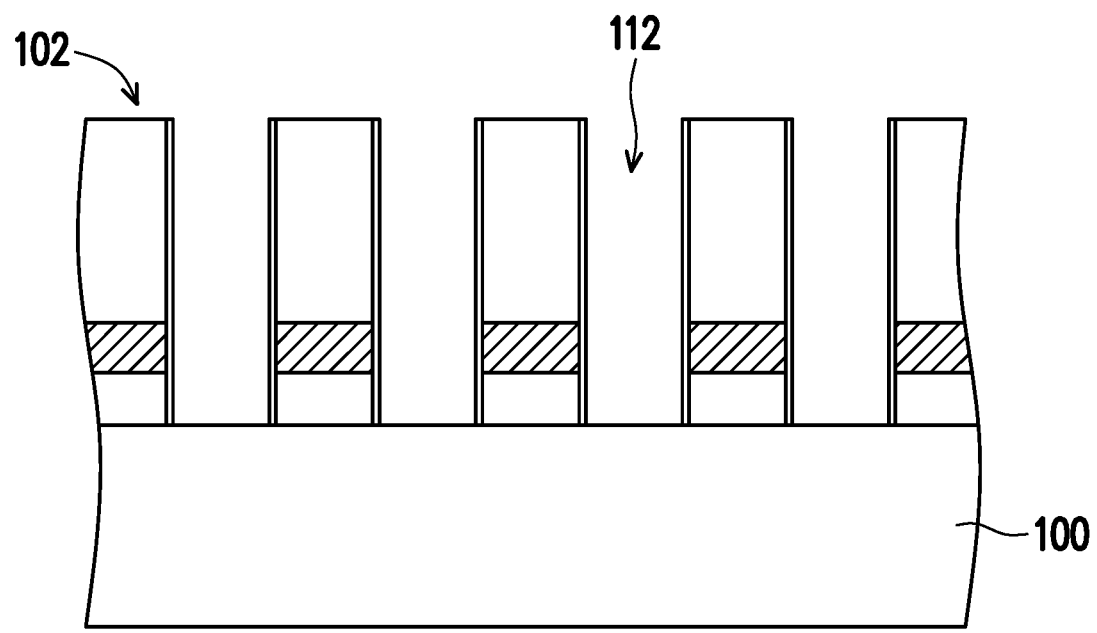
Figure 2E:
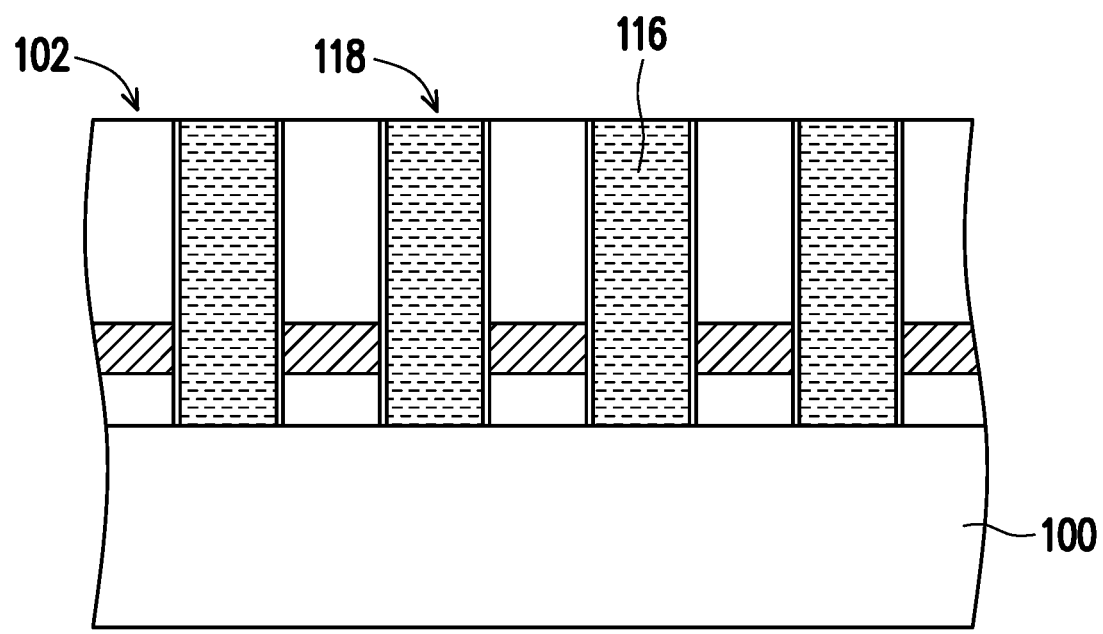
Figure 2F:
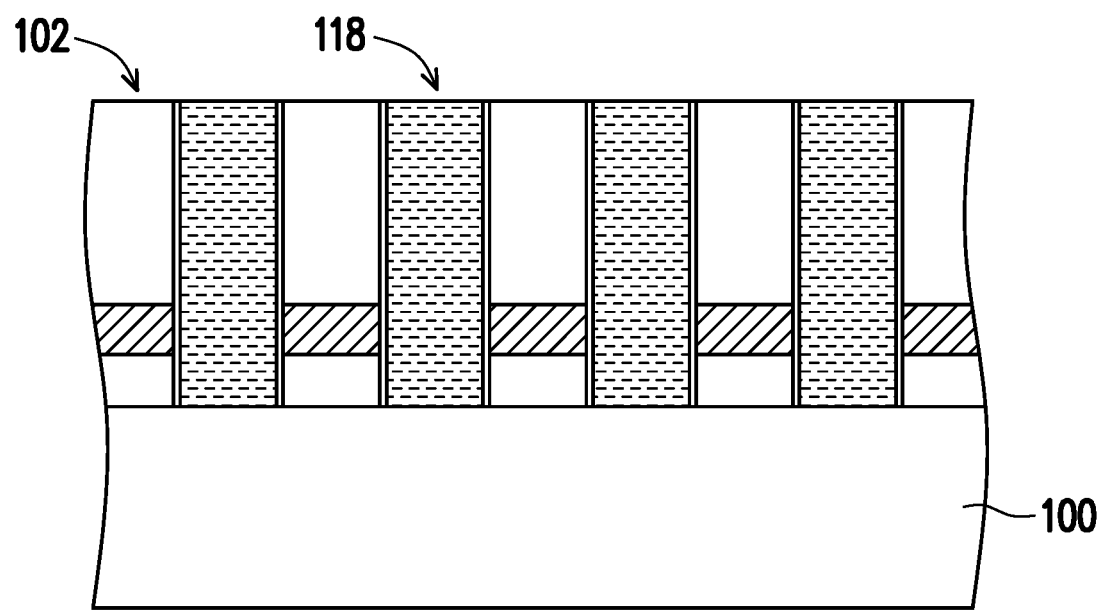
Figure 2G:
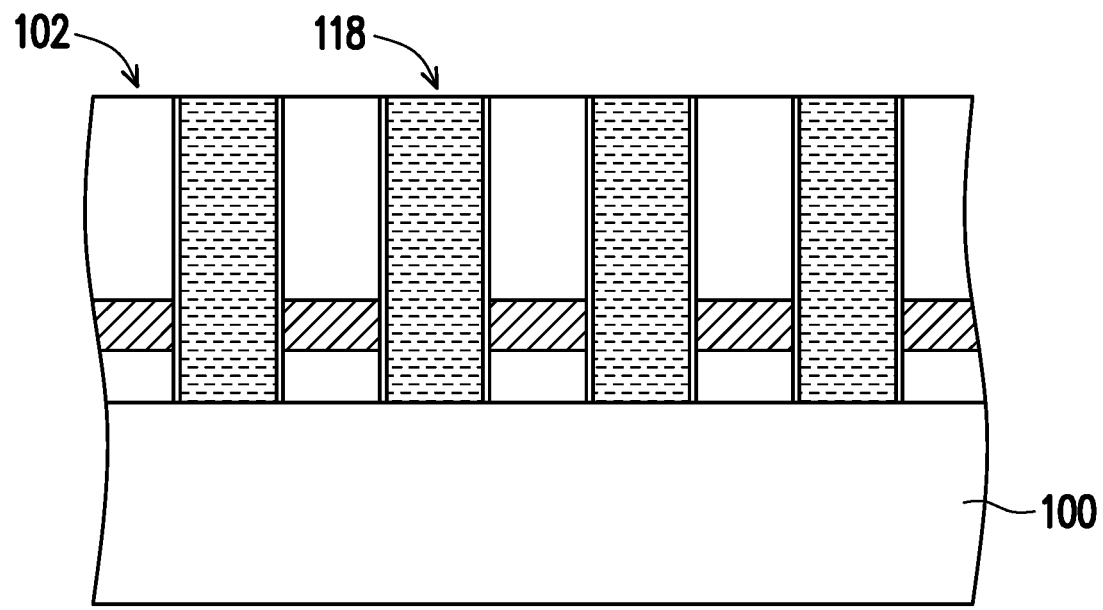
Figure 2H:
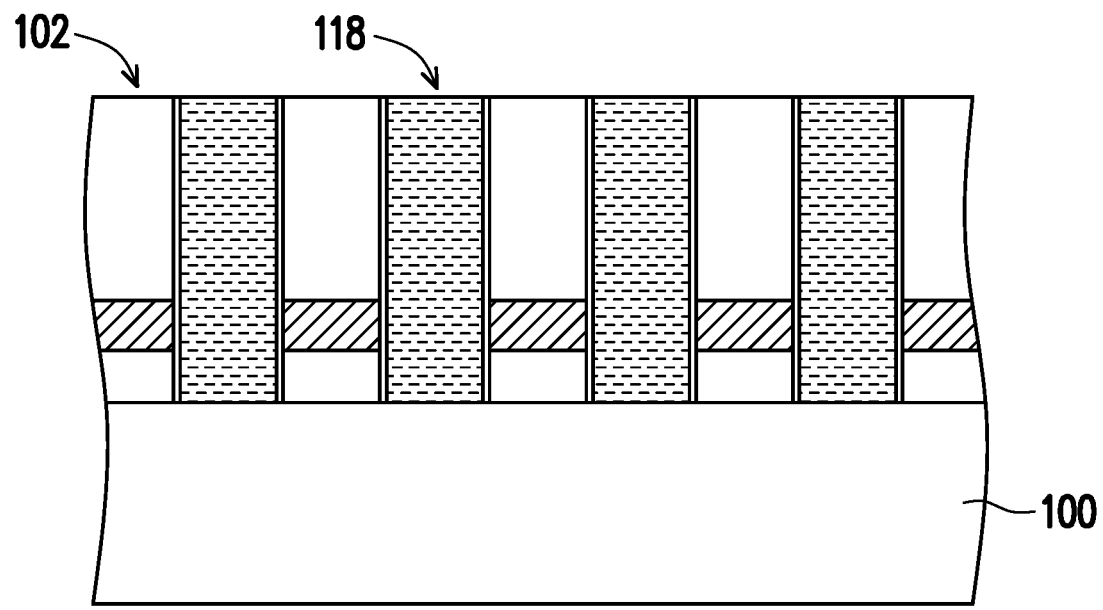
Figure 3A:
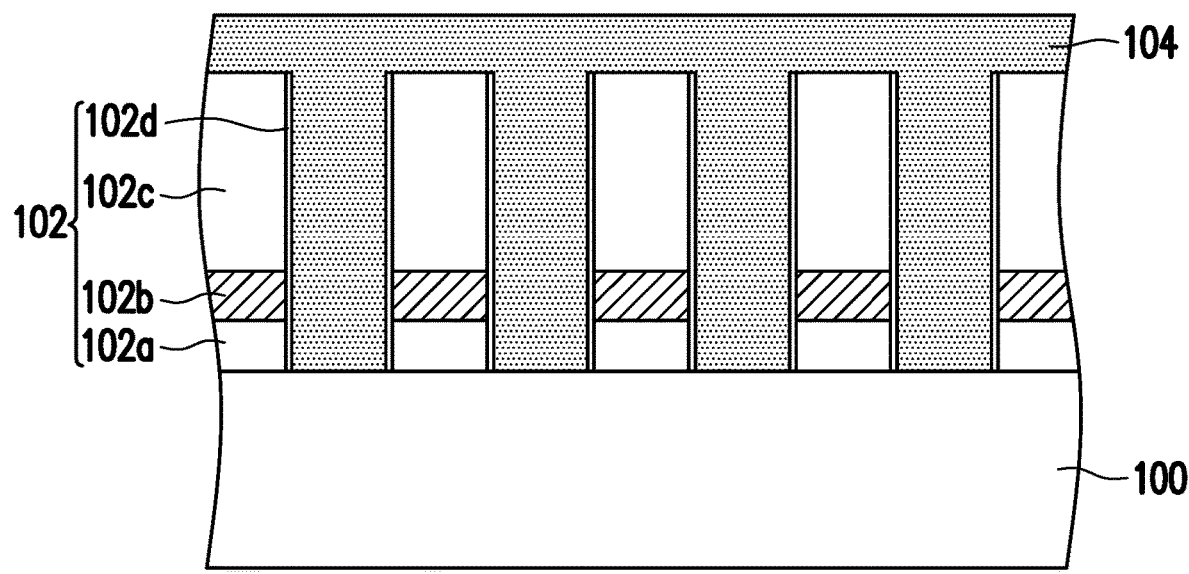
FIGS. 3A to 3H are schematic cross-sectional views of the manufacturing process along the B-B line in FIGS. 1A to 1H.
Figure 3B:
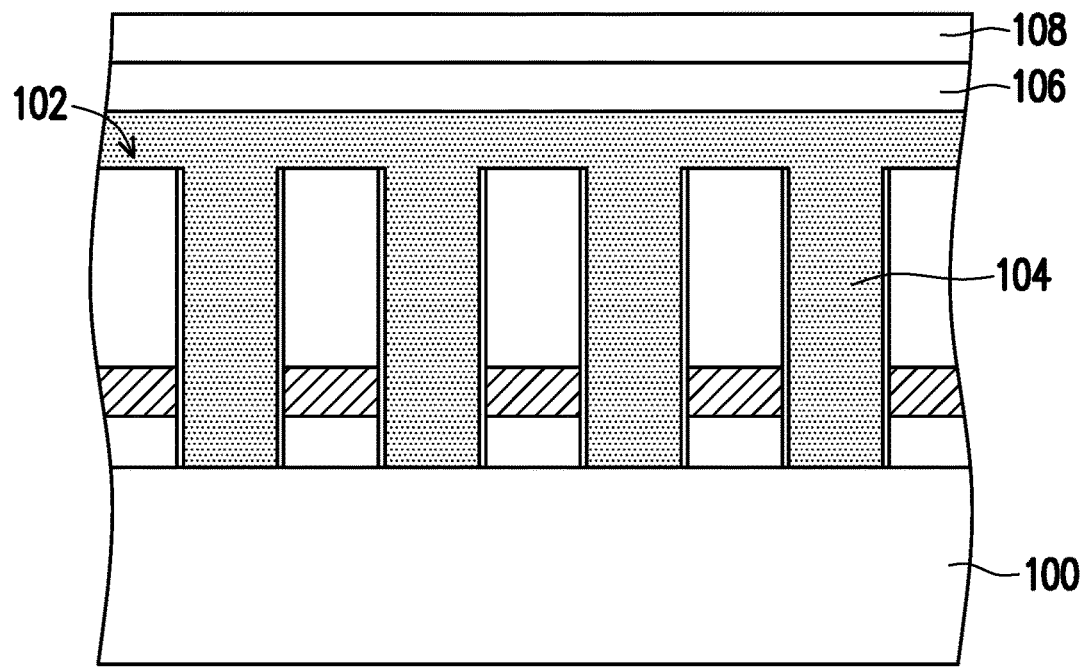
Figure 3C:
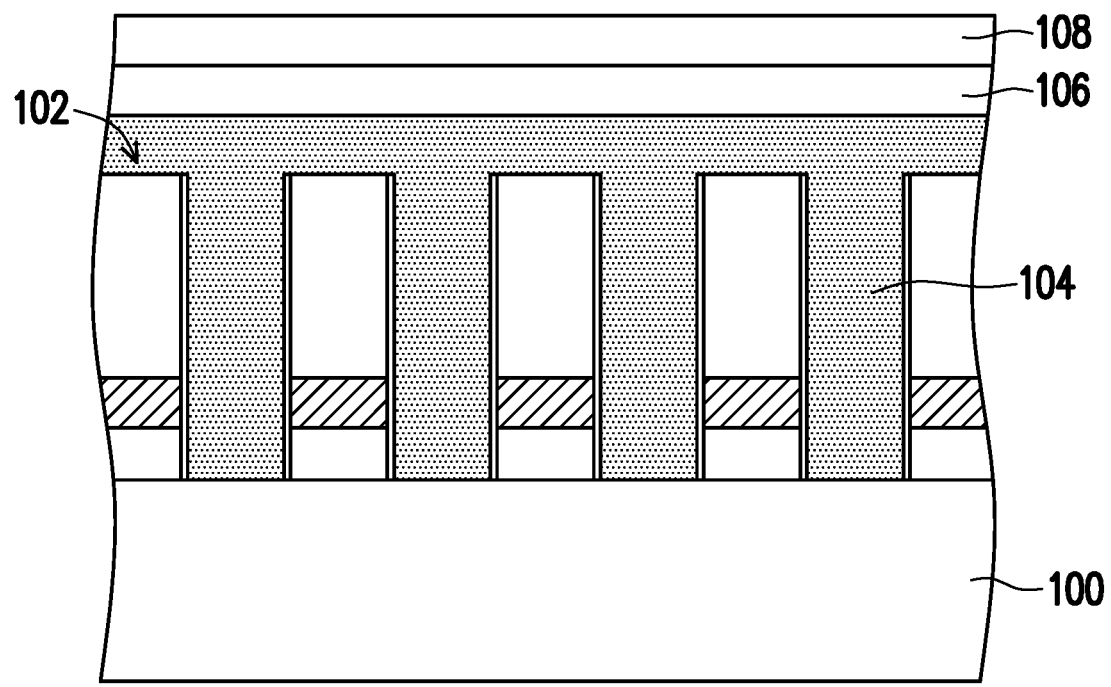
Figure 3D:
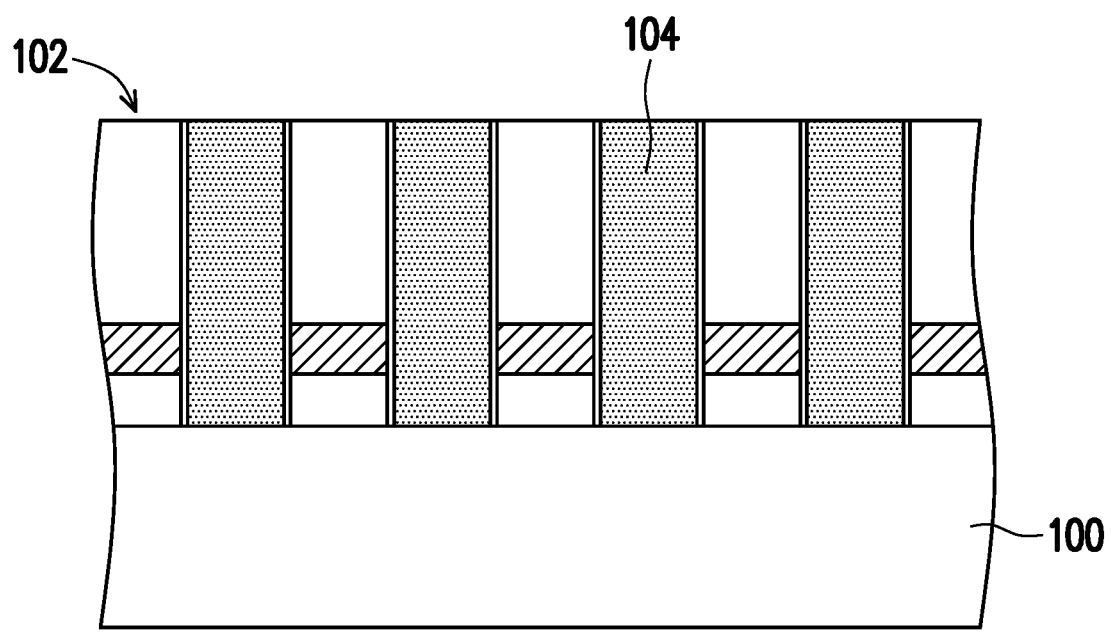
Figure 3E:
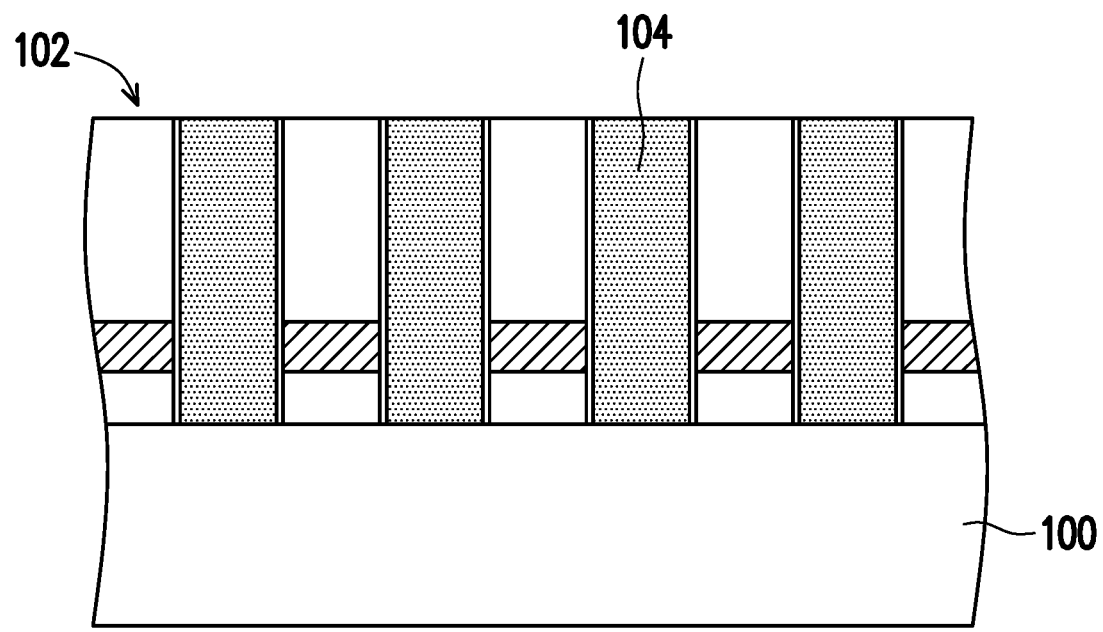
Figure 3F:
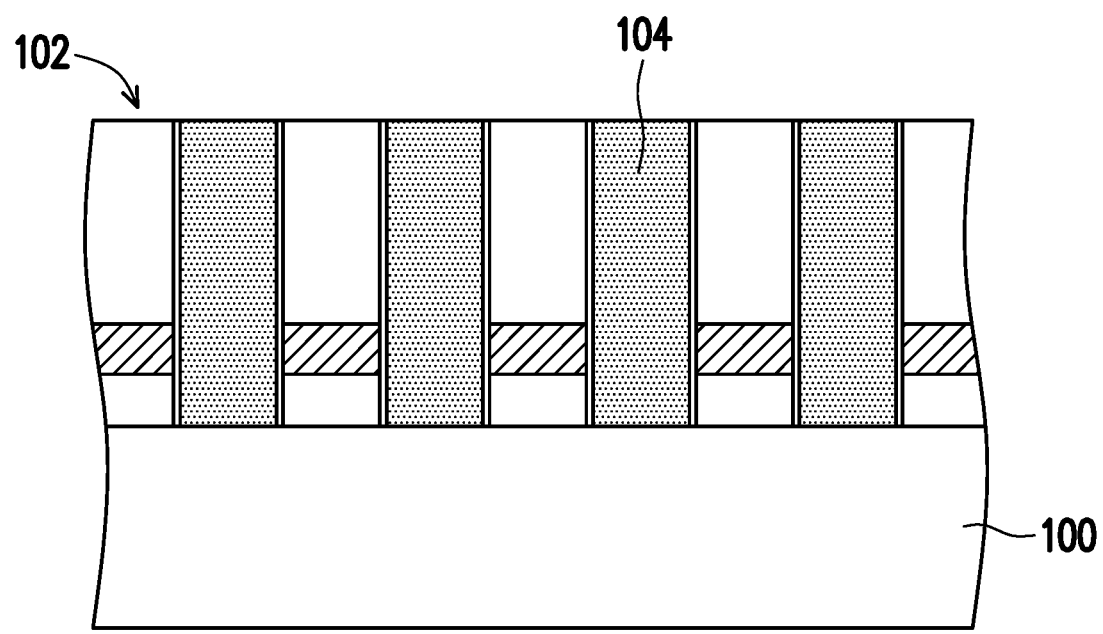
Figure 3G:
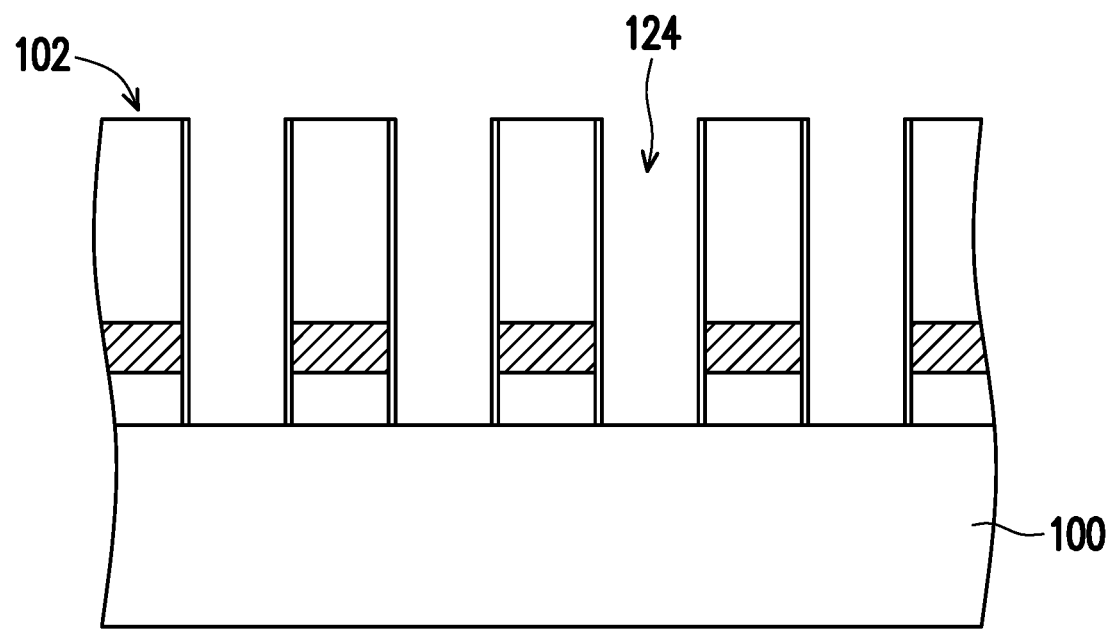
Figure 3H:
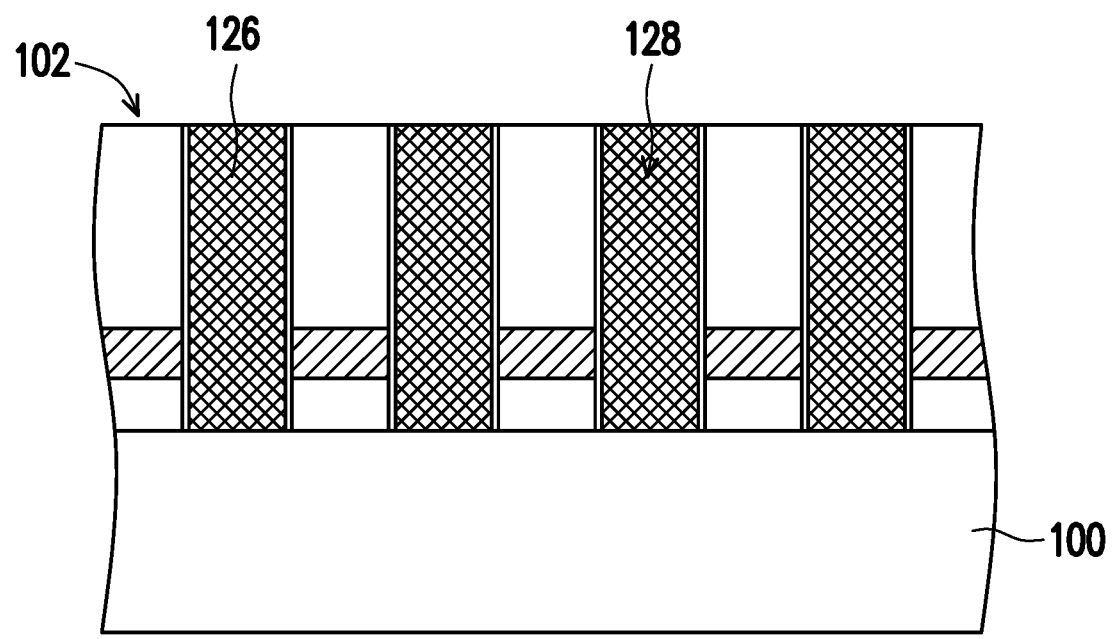
Figure 4A:
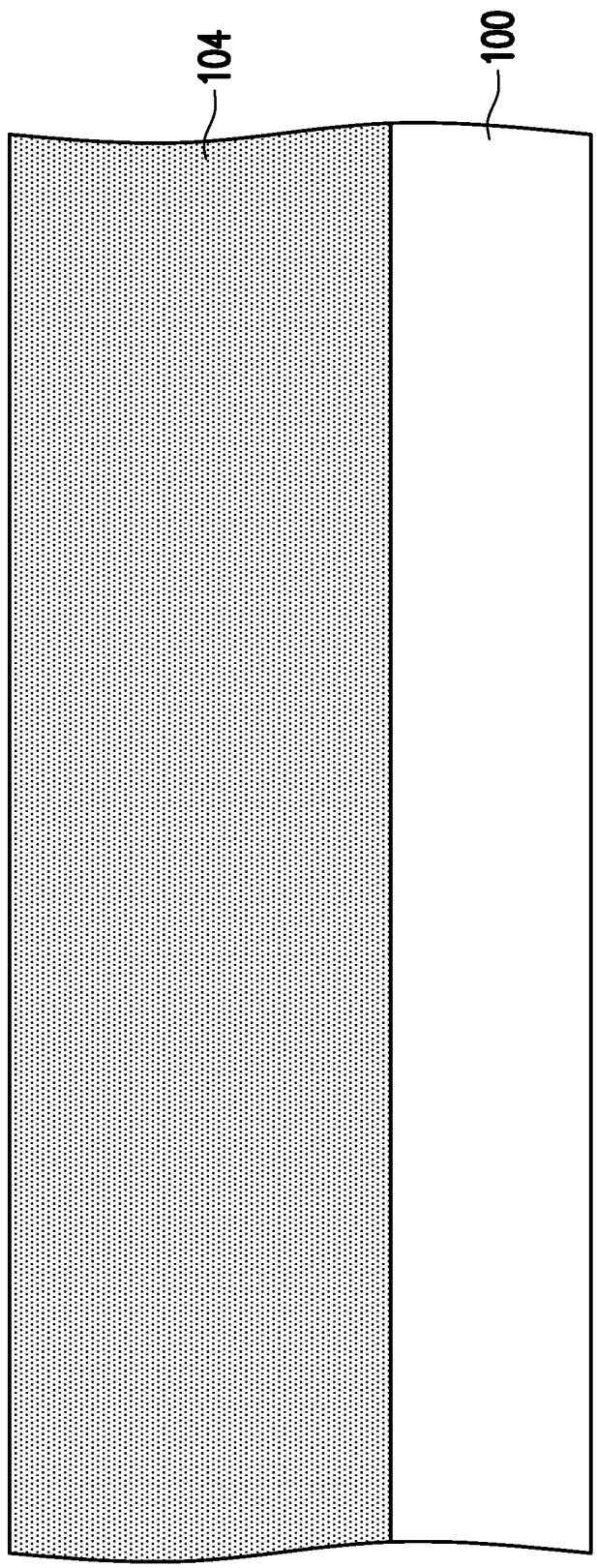
Figure 4B:
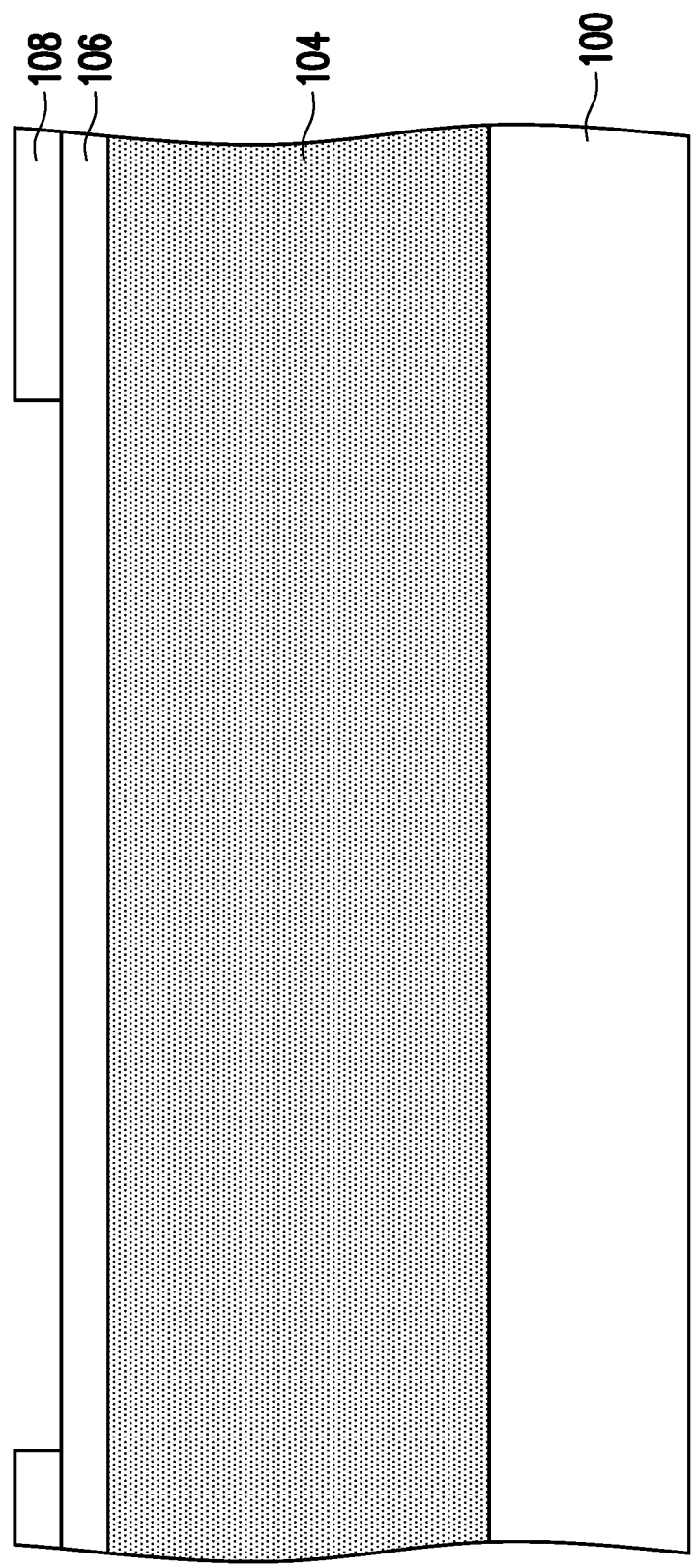
Figure 4C:
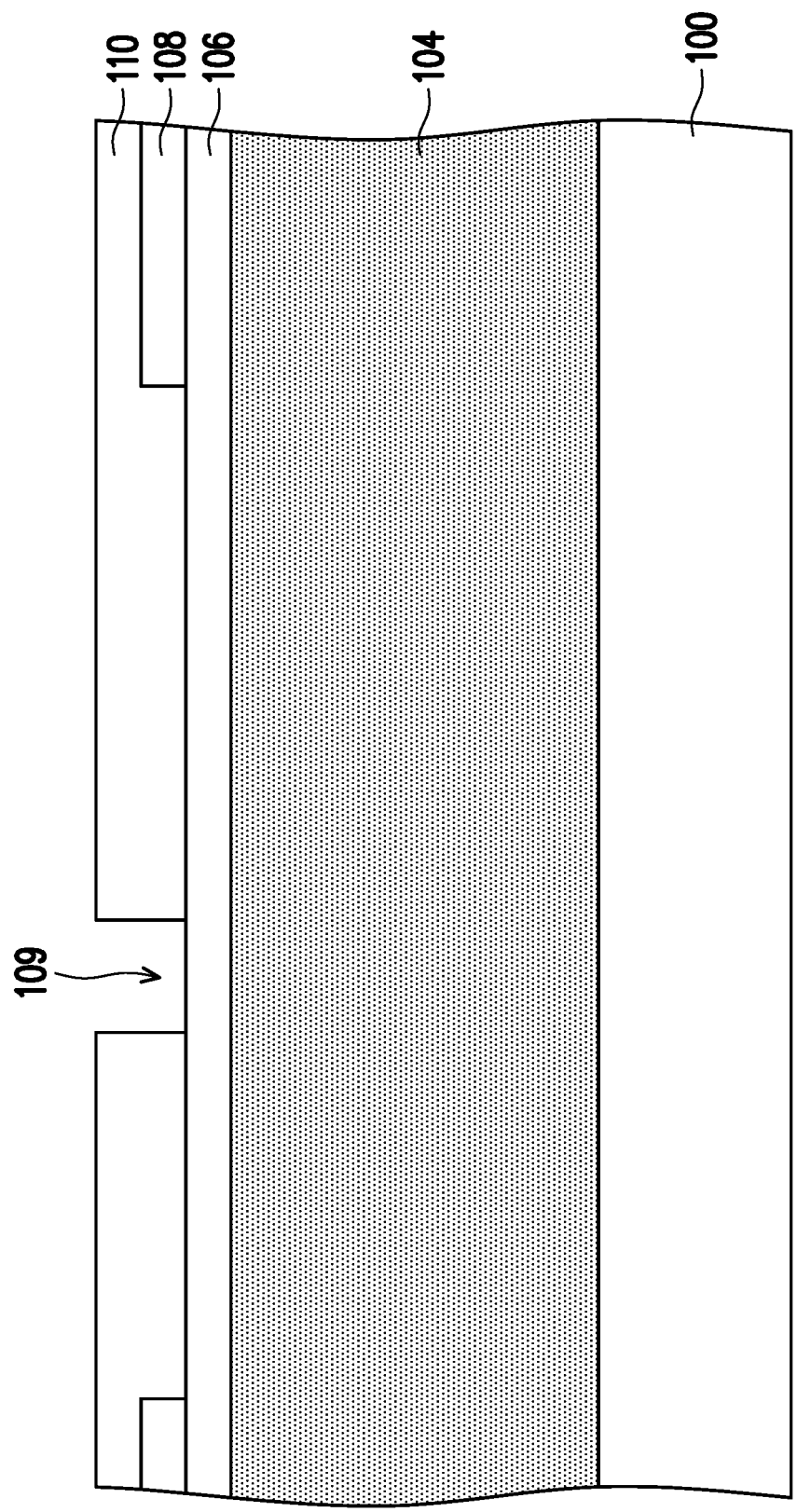
Figure 4D:
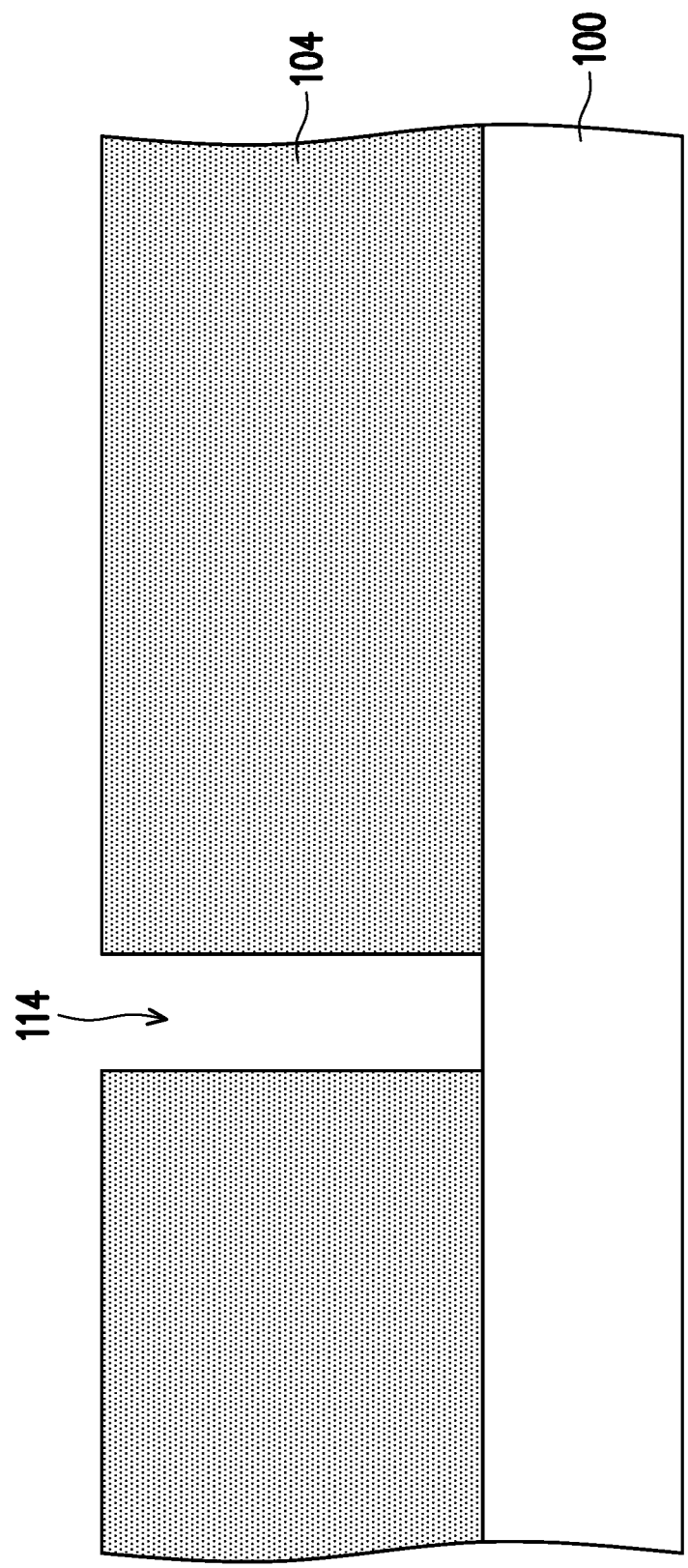
Figure 4E:
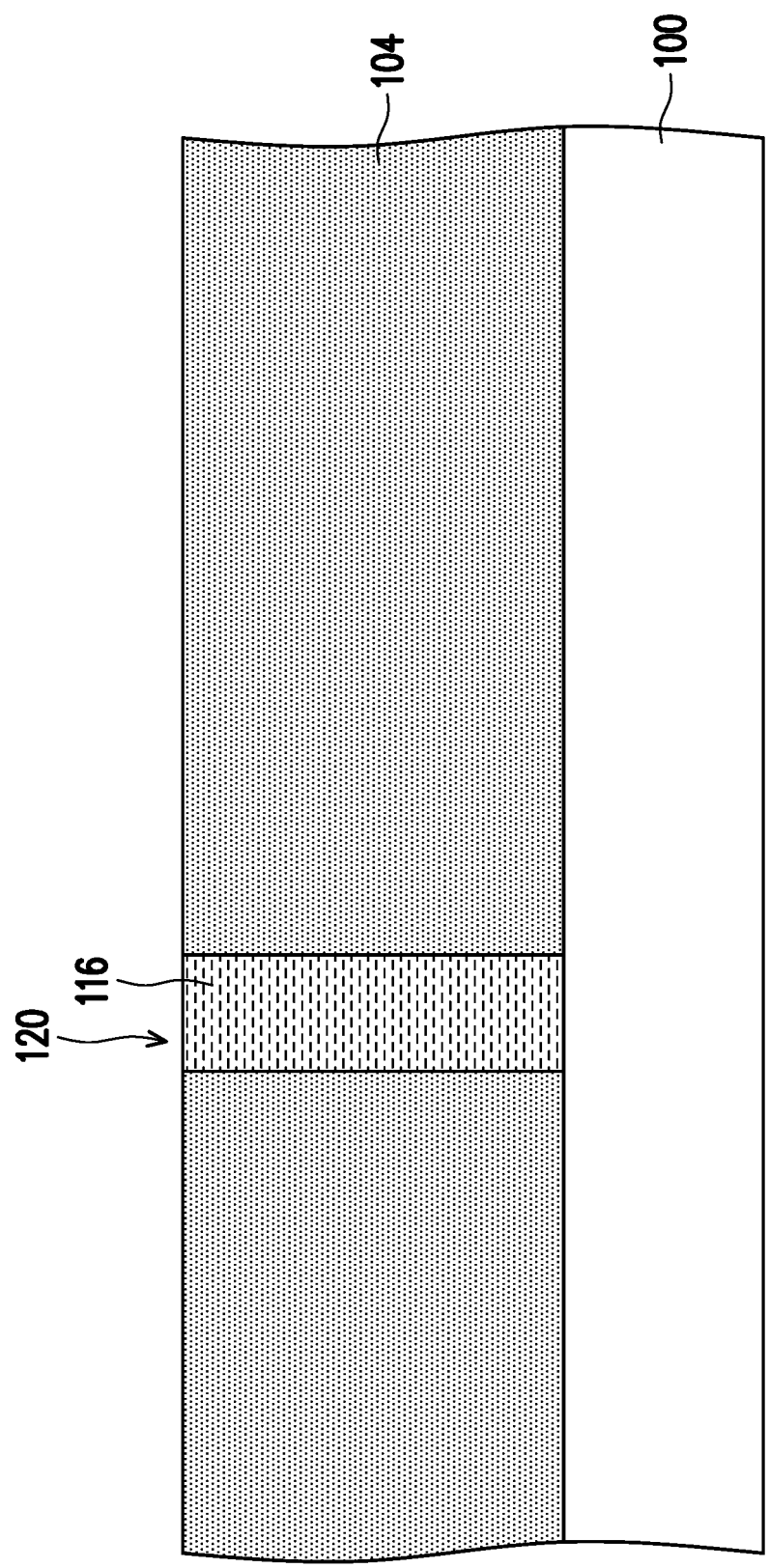
Figure 4F:
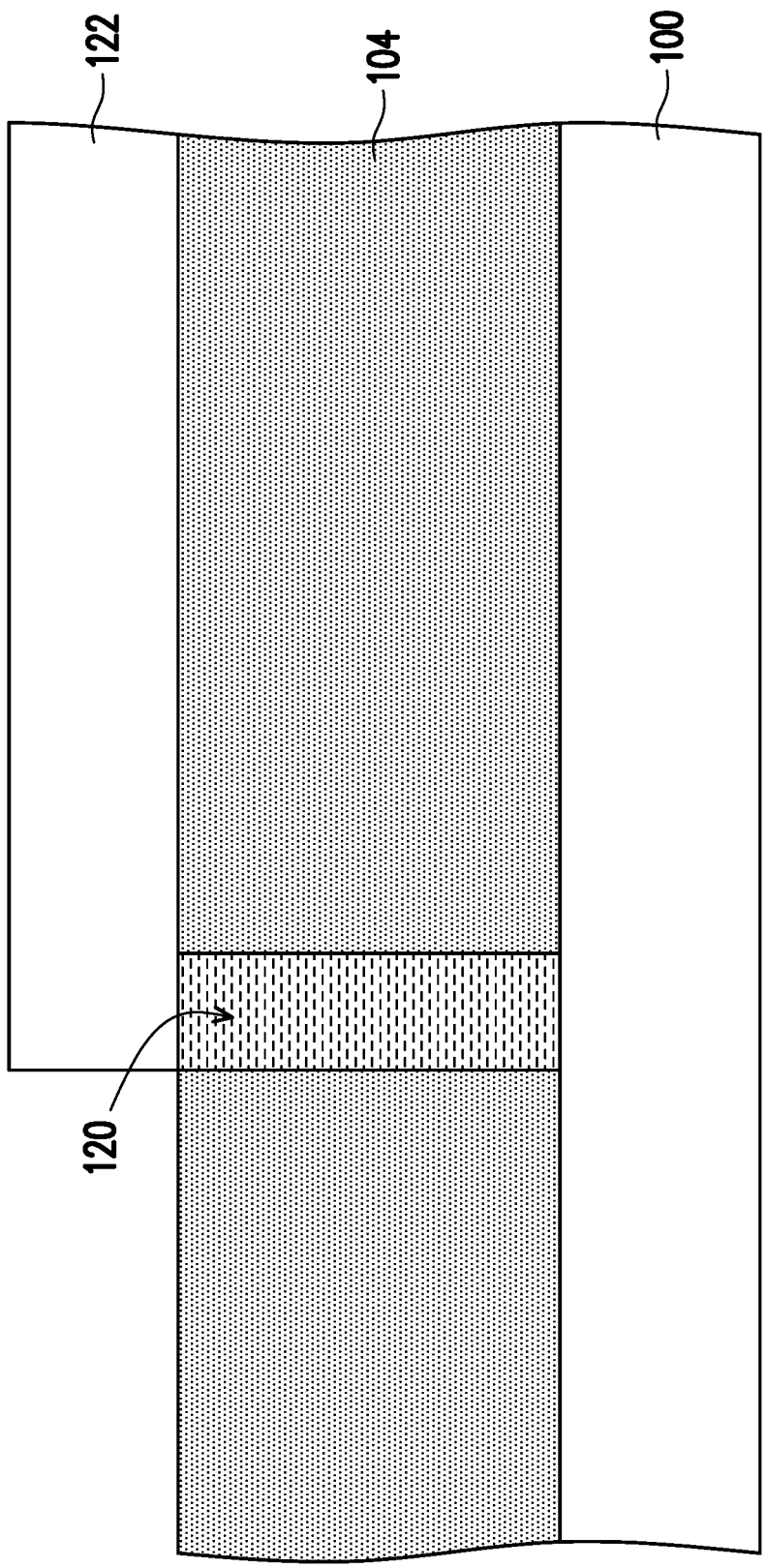
Figure 4H:
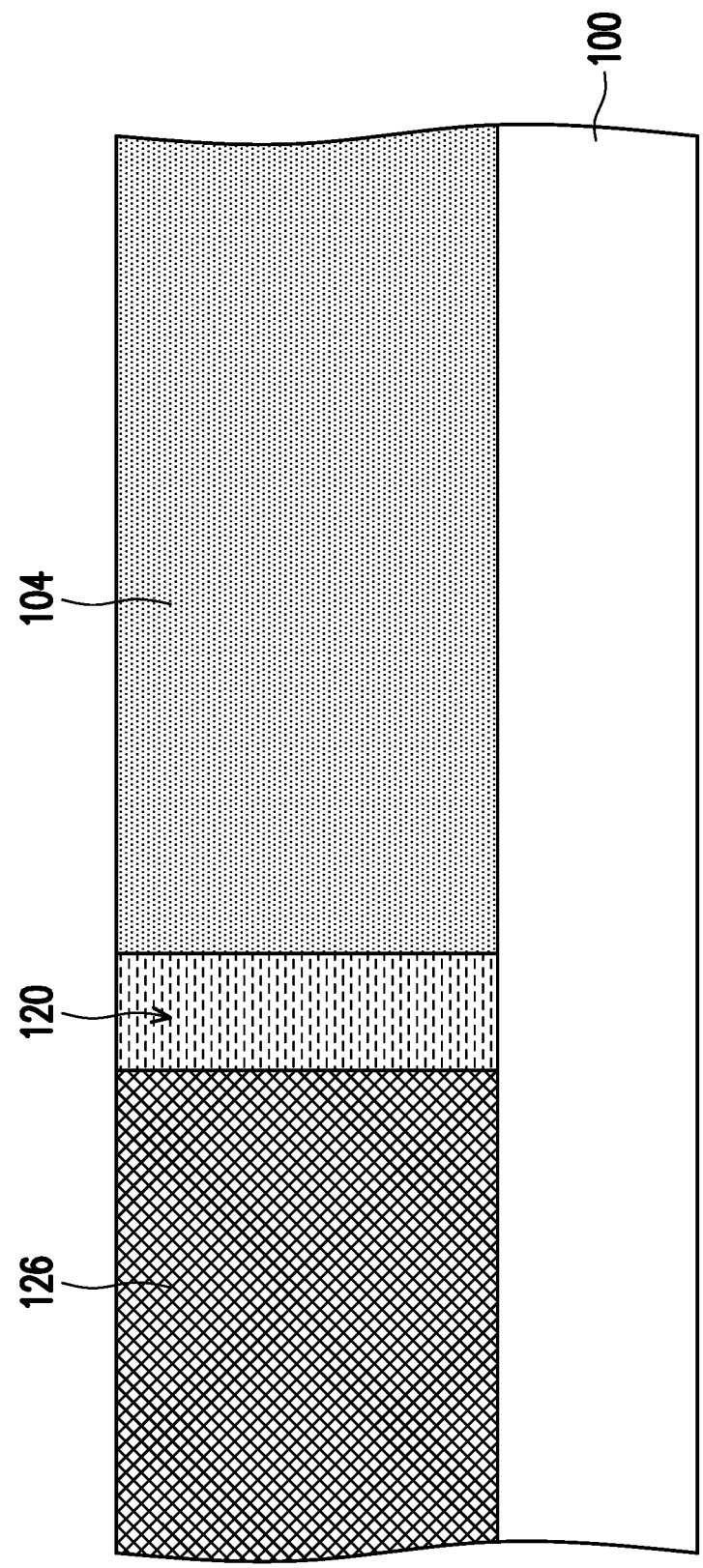

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In addition, the terms mentioned in the text, such as "comprising", "including" and "having" are all open-ended terms, i.e., meaning "including but not limited to".

In addition, the directional terms mentioned in the text, such as "on" and "under", are merely used to refer to the drawings and are not intended to limit the present invention.

FIGS. 1A to 1H are schematic top views of a manufacturing process of a semiconductor memory device according to an embodiment of the invention. FIGS. 2A to 2H are schematic cross-sectional views of the manufacturing process along the A-A line in FIGS. 1A to 1H. FIGS. 3A to 3H are schematic cross-sectional views of the manufacturing process along the B-B line in FIGS. 1A to 1H. FIGS. 4A to 4H are schematic cross-sectional views of the manufacturing process along the C-C line in FIGS. 1A to 1H. The semiconductor memory device of the embodiment of the present invention is, for example, a DRAM.

Referring to FIGS. 1A, 2A, 3A and 4A, a substrate 100 is provided. The substrate 100 is, for example, a silicon substrate. The substrate 100 has a memory region 100a and a periphery region 100b surrounding the memory region 100a. Other known elements, such as an isolation structure, a gate structure (also known as an embedded word line), a source region, a drain region, and the like may be formed in the substrate 100. The gate structure, source region, drain region, etc. are formed in the active areas (not shown) of the substrate 100. However, in order to make the drawings clear, the above-mentioned known elements are omitted from the drawings. Then, a plurality of bit line structures 102 are formed on the substrate 100. These bit line structures 102 are arranged parallel to each other on the substrate 100 in the memory region 100a. In the present embodiment, the bit line structures 102 are extended into the periphery region 100b, but the present invention is not limited thereto.

In the present embodiment, each of the bit line structure 102 includes a stacked structure composed of an insulating layer 102a, a conductive layer 102b and a mask layer 102c sequentially disposed on the substrate 100, and a spacer 102d on the sidewall of the stacked structure, but the present invention is not limited thereto. In other embodiments, the bit line structure may have other suitable architectures. In addition, in order to clarify the drawing, the spacer 102d on the sidewall of the stacked structure is omitted in FIG. 1A. In the present embodiment, the insulating layer 102a is, for example, a nitride layer, the conductive layer 102b is, for example, a tungsten layer, the mask layer 102c is, for example, a nitride layer, and the spacer 102d is, for example, a nitride spacer, but the present invention is not limited thereto.

Next, a dielectric layer 104 is formed on the substrate 100 in the memory region 100a and the periphery region 100b. The dielectric layer 104 covers the bit line structures 102 on the substrate 100. The dielectric layer 104 is used to define contacts for connecting the substrate 100 and the capacitor in the memory device. In the present embodiment, the dielectric layer 104 is, for example, an oxide layer.

Referring to FIGS. 1B, 2B, 3B and 4B, a mask layer 106 is formed in the memory region 100a and the periphery region 100b. The mask layer 106 covers the entire dielectric layer 104. In the present embodiment, the mask layer 106 is, for example, an oxynitride layer. Next, a patterned mask layer 108 is formed on the mask layer 106. The extending direction of patterned mask layer 108 and the extending direction of bit line structures 102 are crossed each other. In the present embodiment, the extending direction of the patterned mask layer 108 is perpendicular to the extending direction of the bit line structure 102, but the present invention is not limited thereto. In addition, the patterned mask layer 108 exposes the boundary between the memory region 100a and the periphery region 100b and a part of the periphery region 100b. In the present embodiment, the patterned mask layer 108 is, for example, a polysilicon layer.

Referring to FIGS. 1C, 2C, 3C and 4C, a patterned mask layer 110 is formed in the memory region 100a and the periphery region 100b. The patterned mask layer 110 exposes a part of the patterned mask layer 108 in the memory region 100a and the mask layer 106 not covered by the patterned mask layers 108 in the memory region 100a, and covers a portion of the periphery region 100b and exposes the boundary 109 between the memory region 100a and the periphery region 100b. In the present embodiment, the patterned mask layer 110 is, for example, a patterned photoresist layer.

Referring to FIGS. 1D, 2D, 3D, and 4D, using the patterned mask layer 110, patterned mask layer 108 and mask layer 106 as an etching mask, an etching process is performed to remove a part of the dielectric layer 104, and thus a plurality of insulating pillar holes 112 are formed between the adjacent bit line structures 102 in the memory region 100a, and a plurality of guard pillar holes 114 are formed in the dielectric layer 104 between the adjacent bit line structures 102 at the boundary 109 between the memory region 100a and the periphery region 100b. The guard pillar holes 114 may expose the active areas of substrate 100.

In detail, after the patterned mask layer 110 is formed, the patterned mask layer 110 and the patterned mask layer 108 are used as an etching mask, and an anisotropic etching process is performed to remove the portion of the mask layer 106 not covered by the patterned mask layer 110 and the patterned mask layer 108. As a result, a part of the dielectric layer 104 is exposed. Then, the patterned mask layer 110 is removed. Next, using the patterned mask layer 108 and the remaining mask layer 106 as an etching mask, an anisotropic etching process is performed to remove the dielectric layer 104 not covered by the patterned mask layer 108 and the remaining mask layer 106. At this time, in the memory region 100a, a portion of the dielectric layer 104 between the adjacent bit line structures 102 is removed to expose a part of the substrate 100, and thus insulating pillar holes 112 are formed. In addition, in the memory region 100a, the dielectric layer 104 located between the adjacent bit line structures 102 and covered by the patterned mask layer 108 remains on the substrate 100. That is to say, in the memory region 100a, between the adjacent bit line structures 102, a plurality of insulating pillar holes 112 are formed in the dielectric layer 104 remaining on the substrate 100. In addition, at the boundary 109 between the memory region 100a and the periphery region 100b, a part of the dielectric layer 104 between the adjacent bit line structures 102 is removed to expose a portion of the substrate 100, and thus guard pillar holes 114 are formed. After that, the patterned mask layer 108 and the remaining mask layer 106 are removed. Then, a part of the dielectric layer 104 is removed so that the top surface of the remaining dielectric layer 104 is coplanar with the top surface of the bit line structures 102. The method for removing a part of the dielectric layer 104 is, for example, a planarization process.

In the present embodiment, the patterned mask layer 110, the patterned mask layer 108 and the mask layer 106 are used to define the insulating pillar holes 112 and the guard pillar holes 114, but the present invention is not limited thereto. In other embodiments, the insulating pillar holes 112 and the guard pillar holes 114 may be defined with other types of mask layers according to actual requirements, which is well known to those skilled in the art and will not be described here.

Referring to FIGS. 1E, 2E, 3E and 4E, the insulating material 116 is formed in the insulating pillar holes 112 and the guard pillar holes 114 to form the insulating pillars 118 in the insulating pillar holes 112 and the guard pillars 120 in the guard pillar holes 114. In this way, in the memory region 100a, a plurality of insulating pillars 118 spaced apart from each other are formed between the adjacent bit line structures 102. In addition, at the boundary 109 between the memory region 100a and the periphery region 100b, guard pillars 120 are formed between the adjacent bit line structures 102. In the present embodiment, the insulating material 116 and the dielectric layer 104 have different materials (for example, having different etching selection ratios), so that the dielectric layer 104 can be easily removed in the subsequent process. The method for forming the insulating material 116 in the insulating pillar holes 112 and the guard pillar holes 114 includes, for example, forming the insulating material 116 on the substrate 100 and filling the insulating pillar holes 112 and the guard pillar holes 114, and then performing a planarization process or an etching back process to remove insulating material 116 outside insulating pillar hole 112 and guard pillar hole 114. Therefore, in the present embodiment, the top surfaces of the insulating pillar 118 and the guard pillar 120 are coplanar with the top surface of the bit line structure 102.

Referring to FIGS. 1F, 2F, 3F and 4F, a patterned mask layer 122 is formed. In the present embodiment, the patterned mask layer 122 covers the periphery region 100b and the boundary 109 between the memory region 100a and the periphery region 100b, and covers the entire of each of the guard pillars 120, but the present invention is not limited thereto. In other embodiments, the patterned mask layer 122 covers the periphery region 100b and the boundary 109 between the memory region 100a and the periphery region 100b, but only covers a part of each of the guard pillars 120. Alternatively, the patterned mask layer 122 only covers the periphery region 100b. That is, the patterned mask layer 122 covers at least the dielectric layer 104 in the periphery region 100b. In the present embodiment, the patterned mask layer 122 is, for example, a patterned photoresist layer.

Referring to FIGS. 1G, 2G, 3G and 4G, using the patterned mask layer 122 as an etching mask, a wet etching process is performed to remove the exposed dielectric layer 104 (ie, the dielectric layer 104 in the memory region 100a), so that the contact holes 124 are formed between the adjacent bit line structures 102 and the adjacent insulating pillars 118. The contact holes 124 expose a part of substrate 100. In the present embodiment, since guard pillars 120 have been formed between the adjacent bit line structures 102 at the boundary 109 between the memory region 100a and the periphery region 100b, the dielectric layer 104 in the memory region 100a may be completely removed during the wet etching process, and it may prevent the etching solution from diffusing into the periphery region 100b and removing the dielectric layer 104 in the periphery region 100b. In other words, in the present embodiment, the wet etching process may be used to quickly and completely remove the dielectric layer 104 in the memory region 100a to form the contact holes 124, and at the same time, the dielectric layer 104 in the periphery region 100b may be prevented from being etched and thus affecting the subsequent process. In addition, after performing the above wet etching process, in addition to removing the dielectric layer 104 between the adjacent insulating pillars 118 to form contact holes 124, the dielectric layer 104 between the outermost insulating pillars 118 and the guard pillars 120 are also removed.

In the present embodiment, the guard pillars 120 are formed on the active areas of the substrate 100 to prevent the above wet etching process from damaging the isolation structures in the periphery region 100b, but the present invention is not limited thereto. In another embodiment, an etching stop layer may be disposed on the isolation structures before the above wet etching process, and the guard pillars 120 may be formed on the isolation structures.

Referring to FIGS. 1H, 2H, 3H and 4H, a conductive layer 126 is formed in the contact holes 124 as the contacts 128. The contacts 128 are connected to the substrate 100 and the capacitors formed later. In addition, in the present embodiment, the conductive layer 126 is also formed on the substrate 100 between the outermost insulating pillars 118 and the guard pillars 120 in addition to be formed in the contact holes 124. Since the regions between the outermost insulating pillars 118 and the guard pillars 120 are not the operation regions of the devices, the conductive layer 126 in the areas will not affect the device formed later.

As shown in FIGS. 1H, 2H, 3H and 4H, in the semiconductor memory device of the present embodiment, the bit line structures 102 are arranged parallel to each other on the substrate 100 in the memory region 100a, and the contacts 128 are disposed between the adjacent bit line structures 102 and connected to the substrate 100. The insulating pillars 118 are disposed between the adjacent contacts 128 to separate the contacts 128 from each other. The guard pillars 120 are disposed on the substrate 100 and located between the adjacent bit line structures 102 at the boundary 109 between the memory region 100a and the periphery region 100b, that is, the guard pillars 120 are located at one side of the memory region 100a in the extending direction of the bit line structures 102.

In addition, in the present embodiment, only the guard pillars 120 are disposed at the right end of the bit line structures 102, but the present invention is not limited thereto. In other embodiments, the guard pillars 120 may be disposed at the left and right ends of the bit line structures 102, that is, the guard pillars 120 may be disposed on opposite sides of the memory region 100a in the extending direction of the bit line structures 102.

In addition, in the present embodiment, only the guard pillars are disposed between the adjacent bit line structures at the boundary between the memory region and the periphery region. However, according to the spirit of the present invention, the guard pillars may also be disposed between the adjacent stacked structures with conductive materials at the boundary between the memory region and the periphery region, and the contacts electrically connected to the substrate are disposed between the stacked structures. In this way, a wet etching process may be used to quickly and completely remove the dielectric layer in the memory region to form the contact holes, and at the same time to prevent the dielectric layer in the periphery region from being etched and thus affecting the subsequent process, thereby improving the yield of the semiconductor memory device.

Figure 5:
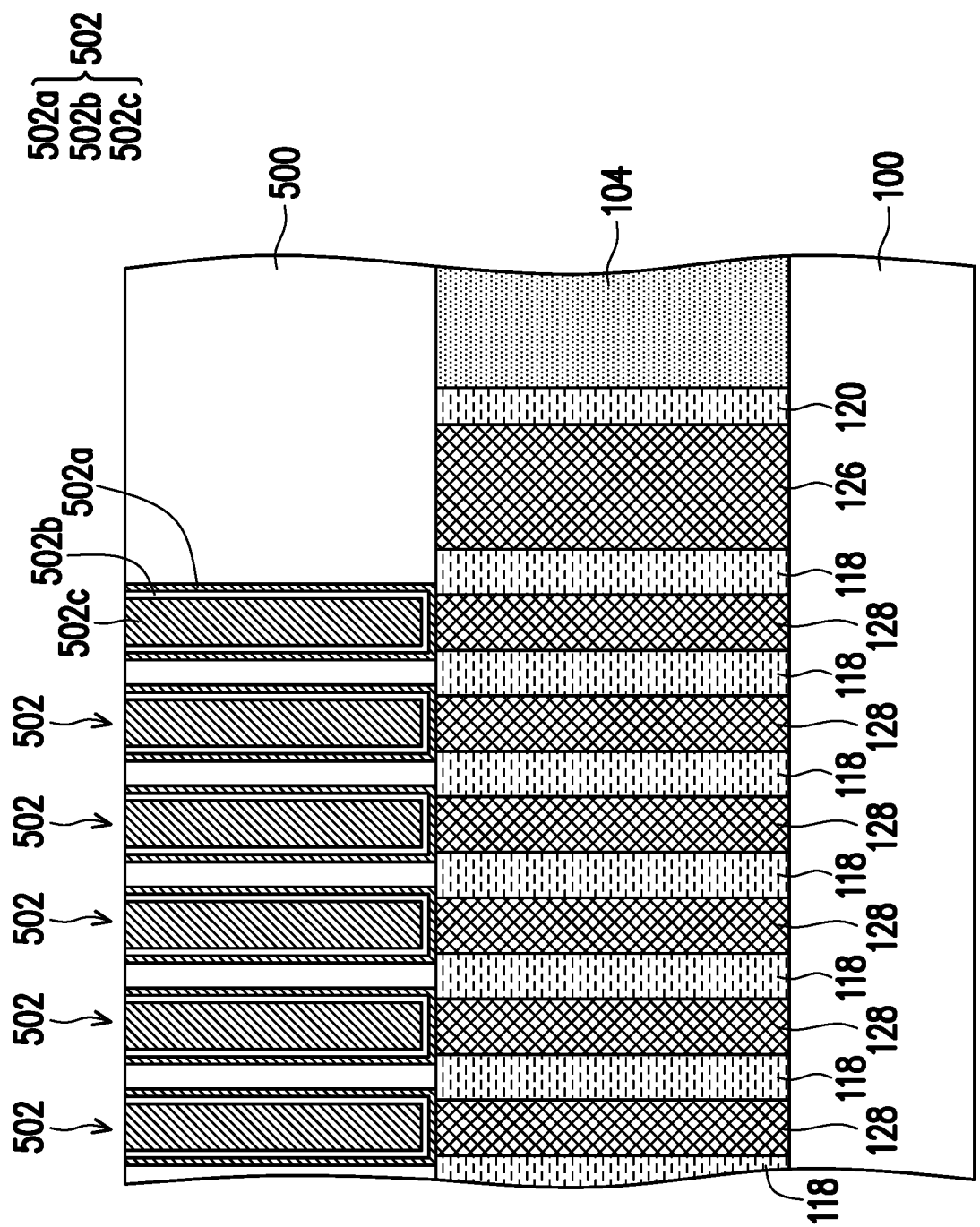
FIG. 5 is a schematic cross-sectional view of the semiconductor memory device shown along the line D-D in FIG. 1H.

After the above structure is formed, other subsequent processes may also be performed. For example, as shown in FIG. 5, after the step described in FIGS. 1H, 2H, 3H and 4H, an interlayer dielectric layer 500 may be formed and capacitors 502 may be formed in the interlayer dielectric layer 500. Each of the capacitors 502 includes a lower electrode 502a, a capacitor dielectric layer 502b and an upper electrode 502c. The structure of the capacitor 502 is only exemplary, and the present invention is not limited thereto. The lower electrode 502a of the capacitor 502 is connected to the contact 128 so that the capacitor 502 may be electrically connected to the substrate 100 through the contact 128.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor memory device, comprising:
a substrate, having a memory region and a periphery region surrounding the memory region;
a dielectric layer, disposed on the substrate in the periphery region;
a plurality of bit line structures, arranged parallel to each other on the substrate in the memory region;
a conductive layer, disposed on the substrate and between the adjacent bit line structures and electrically connected to the substrate;
a plurality of guard pillars, disposed on the substrate and located between the adjacent bit line structures at the boundary between the memory region and the periphery region, wherein each of the plurality of guard pillars is disposed between the dielectric layer and the conductive layer, and the material of the plurality of guard pillars is different from the material of the dielectric layer; and
a plurality of capacitors, disposed on the conductive layer to be electrically connected to the substrate through the conductive layer,
wherein each of the plurality of bit line structures comprises a stacked structure composed of an insulating layer, a bit line conductive layer and a mask layer sequentially disposed on the substrate, and a spacer located on the sidewall of the stacked structure, and the top surfaces of the plurality of guard pillars are coplanar with the top surfaces of the bit line structures.

2. The semiconductor memory device of claim 1, wherein each of the plurality of bit line structures extends along an extending direction, and the plurality of guard pillars are located on at least one side of the memory region in the extending direction of the bit line structures.

3. The semiconductor memory device of claim 1, wherein the plurality of guard pillars are located on active areas of the substrate.

4. A manufacturing method of a semiconductor memory device, comprising:
providing a substrate, wherein the substrate has a memory region and a periphery region surrounding the memory region;
forming a plurality of bit line structures on the substrate, wherein the plurality of bit line structures are arranged parallel to each other on the substrate in the memory region;
forming a dielectric layer on the substrate in the memory region and the periphery region;
forming a plurality of guard pillar holes in the dielectric layer between the adjacent bit line structures at the boundary between the memory region and the periphery region, and forming a plurality of guard pillars in the plurality of guard pillar holes, wherein the material of the plurality of guard pillars is different from the material of the dielectric layer;
forming a first patterned mask layer, wherein the first patterned mask layer covers at least the dielectric layer in the periphery region;
performing a wet etching process to remove the dielectric layer in the memory region to form a plurality of contact holes between the adjacent bit line structures, wherein the remaining dielectric layer is located on the substrate in the periphery region, and each of the plurality of guard pillars is located between the dielectric layer and one of the plurality of contact holes;
forming a conductive layer in the plurality of contact holes; and
foiling a plurality of capacitors on the conductive layer for being electrically connected to the substrate through the conductive layer,
wherein each of the plurality of bit line structures comprises a stacked structure composed of an insulating layer, a bit line conductive layer and a mask layer sequentially disposed on the substrate, and a spacer located on the sidewall of the stacked structure, and the top surfaces of the plurality of guard pillars are coplanar with the top surfaces of the bit line structures.

5. The manufacturing method of claim 4, wherein each of the plurality of bit line structures extends along an extending direction, and the plurality of guard pillars are located on at least one side of the memory region in the extending direction of the bit line structures.

6. The manufacturing method of claim 4, wherein the plurality of guard pillar holes expose active areas of the substrate.

7. The semiconductor memory device of claim 1, wherein the conductive layer forms a plurality of contacts and a plurality of dummy contacts, the plurality of capacitors are disposed on the plurality of contacts respectively, and each of the plurality of guard pillars is formed between the dielectric layer and one of the plurality of dummy contacts.

8. The semiconductor memory device of claim 7, further comprising a plurality of insulating pillars disposed between the adjacent contacts, respectively, and disposed between peripheral ones of the plurality of contacts and the plurality of dummy contacts, respectively.

9. The semiconductor memory device of claim 8, wherein the material of the plurality of the guard pillars is the same as the material of the plurality of insulating pillars.

10. The semiconductor memory device of claim 8, wherein the top surfaces of plurality of insulating pillars and the plurality of guard pillars are coplanar with the top surfaces of the bit line structures.

11. The manufacturing method of claim 4, wherein the conductive layer forms a plurality of contacts and a plurality of dummy contacts, the plurality of capacitors are disposed on the plurality of contacts respectively, and each of the plurality of guard pillars is formed between the dielectric layer and one of the plurality of dummy contacts.

12. The manufacturing method of claim 4, further comprising forming insulating pillar holes in the dielectric layer between the adjacent bit line structures in the memory region, and forming a plurality of insulating pillars in the insulating pillar holes, wherein the plurality of insulating pillars are disposed between the adjacent contacts, respectively, and disposed between peripheral ones of the plurality of contacts and the plurality of dummy contacts, respectively.

13. The manufacturing method of claim 12, wherein the material of the plurality of guard pillars is the same as the material of the plurality of insulating pillars.

14. The manufacturing method of claim 12, wherein a forming method of the plurality of guard pillars and the plurality of insulating pillars comprising:
- forming a second patterned mask layer in the memory region and the periphery region, wherein the second patterned mask layer exposes regions corresponding to the plurality of insulating pillars and the plurality of guard pillars;
- performing an anisotropic etching process to remove a part of the dielectric layer to form the plurality of insulating pillar holes and the plurality of guard pillar holes;
- removing the second patterned mask layer; and
- forming an insulating material in the plurality of insulating pillar holes and the plurality of guard pillar holes, wherein the insulating material is different from the material of the dielectric layer.

15. The manufacturing method of claim 12, wherein the top surfaces of plurality of insulating pillars and the plurality of guard pillars are coplanar with the top surfaces of the bit line structures.

* * * * *